(12) United States Patent
Lutze et al.

(10) Patent No.: US 7,796,430 B2
(45) Date of Patent: Sep. 14, 2010

(54) NON-VOLATILE MEMORY USING MULTIPLE BOOSTING MODES FOR REDUCED PROGRAM DISTURB

(75) Inventors: Jeffrey W. Lutze, San Jose, CA (US); Yingda Dong, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 42 days.

(21) Appl. No.: 12/211,348

(22) Filed: Sep. 16, 2008

(65) Prior Publication Data

US 2009/0010065 A1 Jan. 8, 2009

Related U.S. Application Data

(62) Division of application No. 11/555,856, filed on Nov. 2, 2006, now Pat. No. 7,468,911.

(51) Int. Cl.
*G11C 16/04* (2006.01)

(52) U.S. Cl. .............. 365/185.03; 365/185.17; 365/185.19; 365/185.22; 365/185.28

(58) Field of Classification Search ............ 365/185.03, 365/185.17, 185.19, 185.28, 185.22
See application file for complete search history.

(56) References Cited

U.S. PATENT DOCUMENTS

| | | | |
|---|---|---|---|
| 5,386,422 A | 1/1995 | Endoh | |
| 5,522,580 A | 6/1996 | Varner, Jr. | |
| 5,570,315 A | 10/1996 | Tanaka | |
| 5,917,757 A | 6/1999 | Lee | |
| 5,991,202 A | 11/1999 | Derhacobian | |
| 6,046,935 A | 4/2000 | Takeuchi | |
| 6,175,522 B1 | 1/2001 | Fang | |
| 6,181,599 B1 | 1/2001 | Gongwer | |
| 6,222,762 B1 | 4/2001 | Guterman | |
| 6,456,528 B1 | 9/2002 | Chen | |
| 6,522,580 B2 | 2/2003 | Chen | |
| 6,859,397 B2 * | 2/2005 | Lutze et al. ............ 365/185.28 |
| 6,975,537 B2 | 12/2005 | Lutze | |
| 7,020,017 B2 | 3/2006 | Chen | |
| 7,023,733 B2 | 4/2006 | Guterman | |
| 7,046,568 B2 | 5/2006 | Cernea | |

(Continued)

OTHER PUBLICATIONS

International Search Report and Written Opinion of the International Searching Authority, dated Jun. 6, 2008, PCT Patent Appl. No. PCT/US2007/083313, filed Jan. 11, 2007.

*Primary Examiner*—Hoai V Ho
(74) *Attorney, Agent, or Firm*—Vierra Magen Marcus & DeNiro LLP

(57) ABSTRACT

A non-volatile storage system which reduces program disturb. Multiple boosting modes are implemented while programming non-volatile storage. For example, self-boosting, local self-boosting, erased area self-boosting and revised erased area self-boosting may be used. One or more switching criteria are used to determine when to switch to a different boosting mode. The boosting mode may be used to prevent program disturb in unselected NAND strings while storage elements are being programmed in selected NAND strings. By switching boosting modes, an optimal boosting mode can be used as conditions change. The boosting mode can be switched based on various criteria such as program pulse number, program pulse amplitude, program pass number, the position of a selected word line, whether coarse or fine programming is used, whether a storage element reaches a program condition and/or a number of program cycles of the non-volatile storage device.

20 Claims, 16 Drawing Sheets

U.S. PATENT DOCUMENTS

| | | |
|---|---|---|
| 7,196,928 B2 | 3/2007 | Chen |
| 7,218,552 B1 | 5/2007 | Wan |
| 2004/0057287 A1 | 3/2004 | Cernea |
| 2004/0080980 A1 | 4/2004 | Lee |
| 2004/0109357 A1 | 6/2004 | Cernea |
| 2004/0255090 A1 | 12/2004 | Guterman |
| 2005/0024939 A1 | 2/2005 | Chen |
| 2005/0122780 A1 | 6/2005 | Chen |
| 2005/0174852 A1 | 8/2005 | Hemink |
| 2006/0002167 A1 | 1/2006 | Rudeck |
| 2006/0126390 A1 | 6/2006 | Gorobets |
| 2006/0140007 A1 | 6/2006 | Cernea |
| 2006/0140012 A1 | 6/2006 | Wan |
| 2006/0158947 A1 | 7/2006 | Chan |
| 2006/0203557 A1 | 9/2006 | Fukuda |

\* cited by examiner

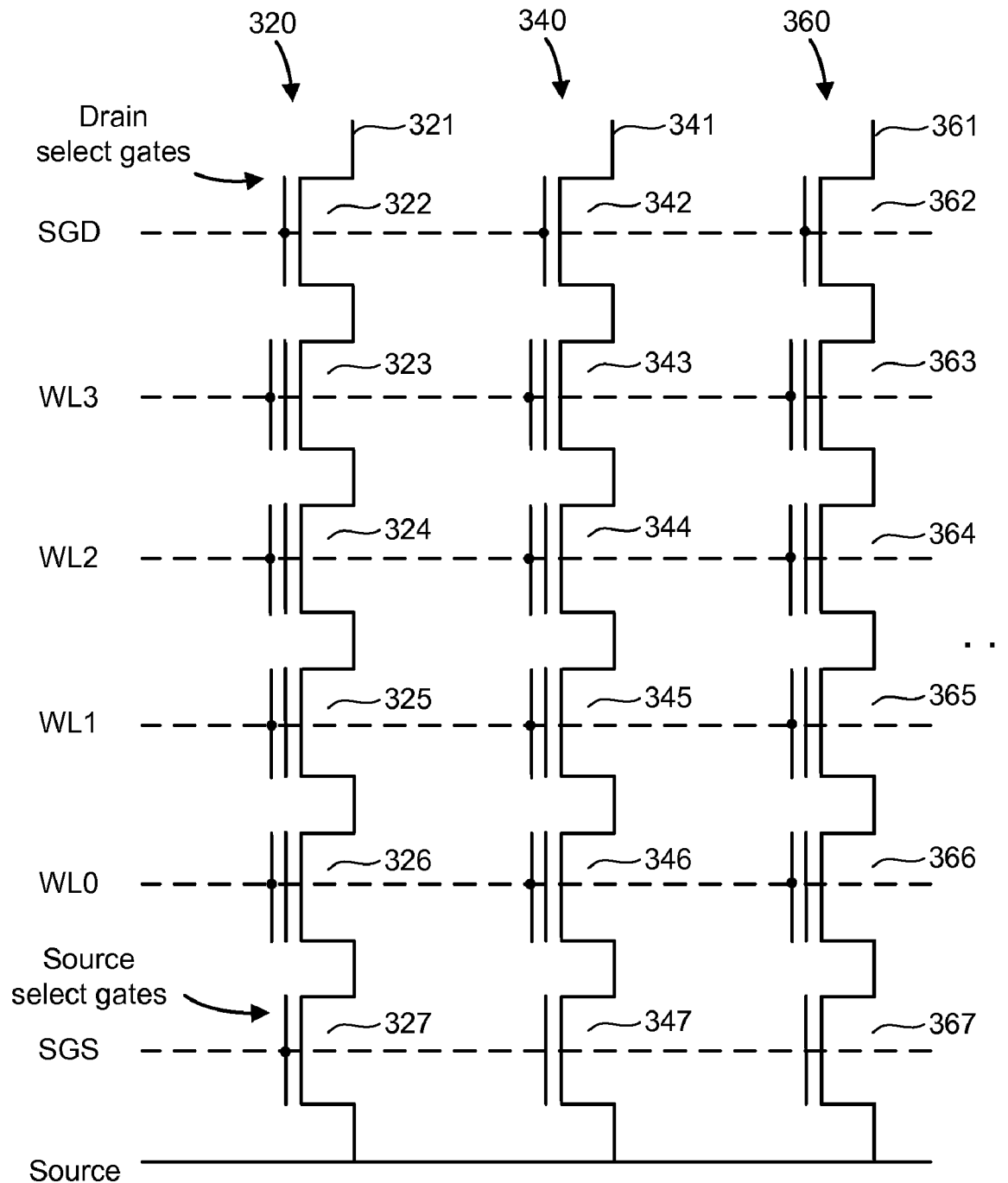

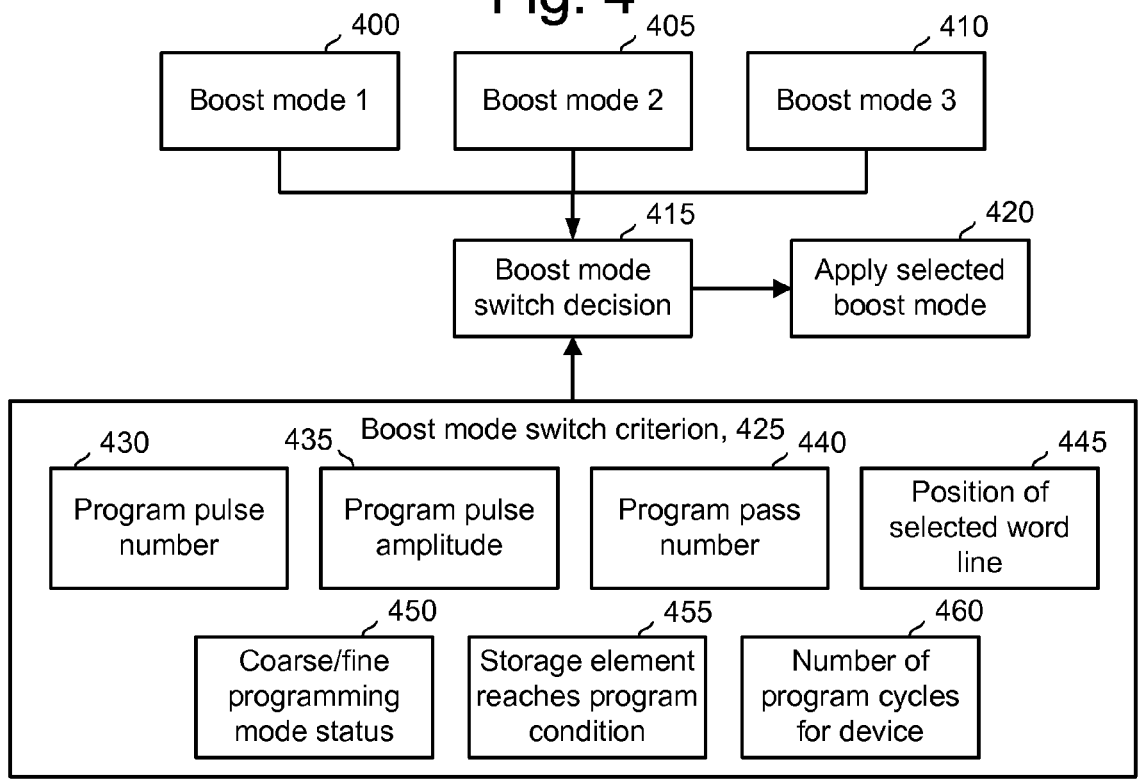
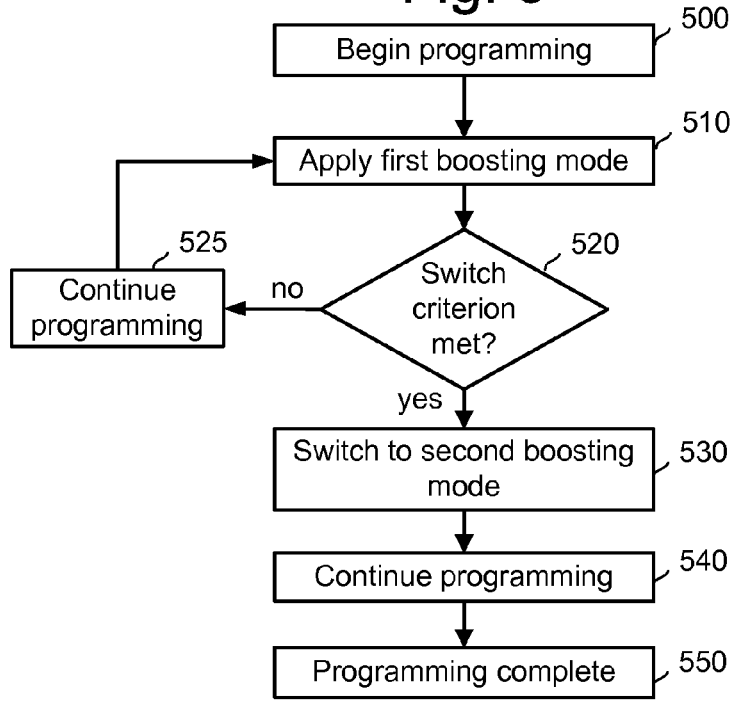

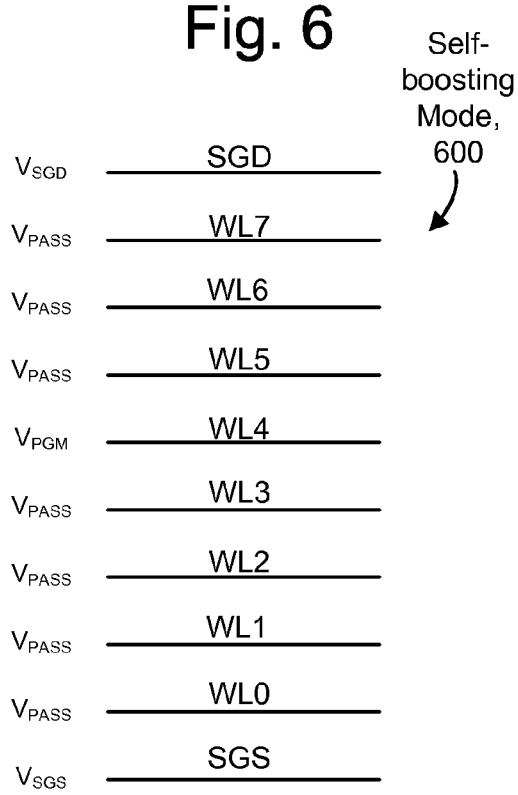
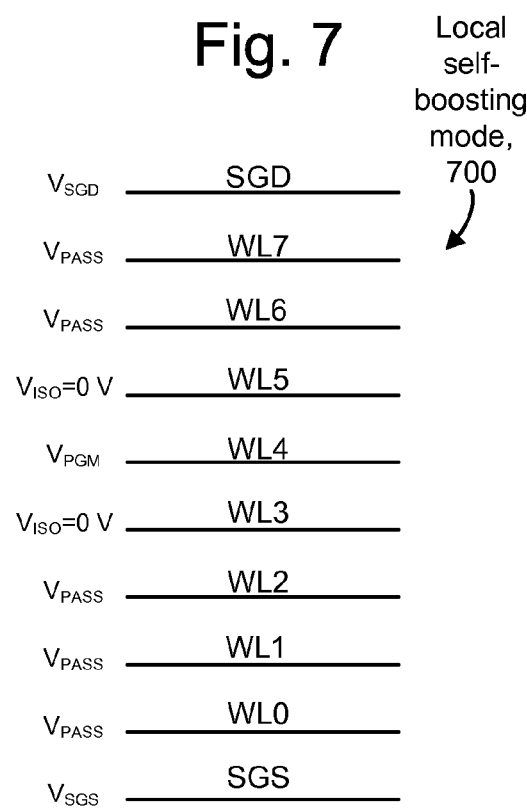
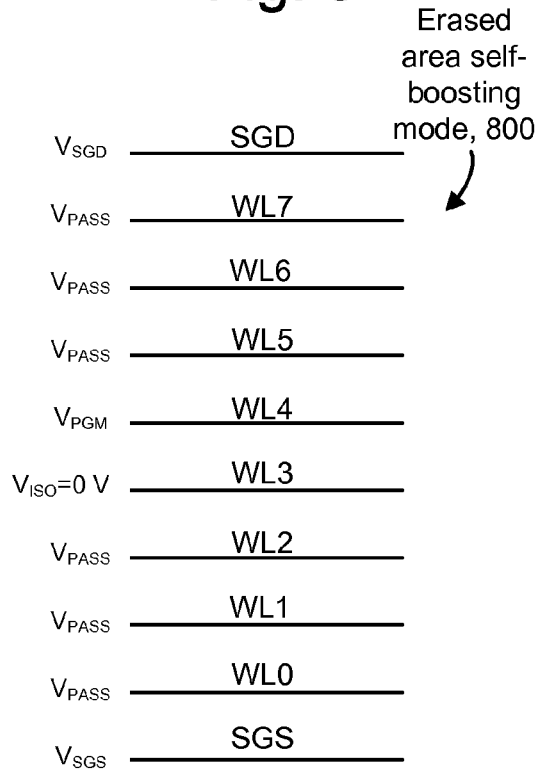
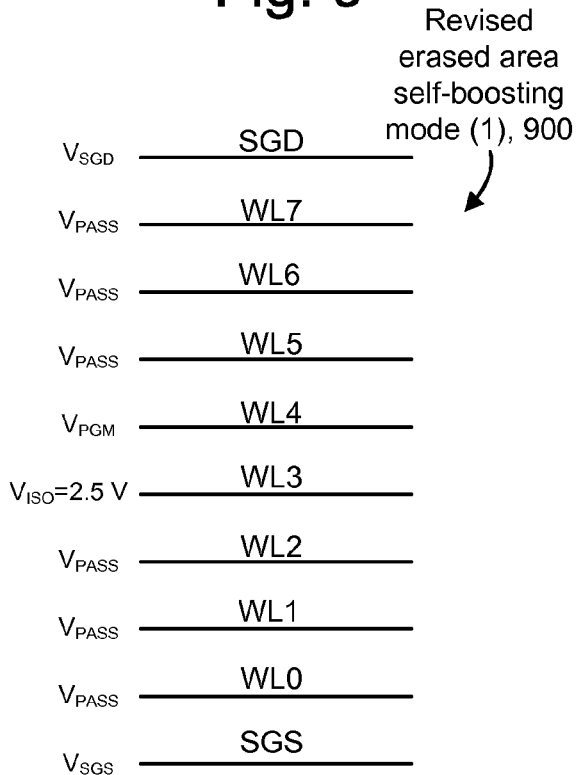

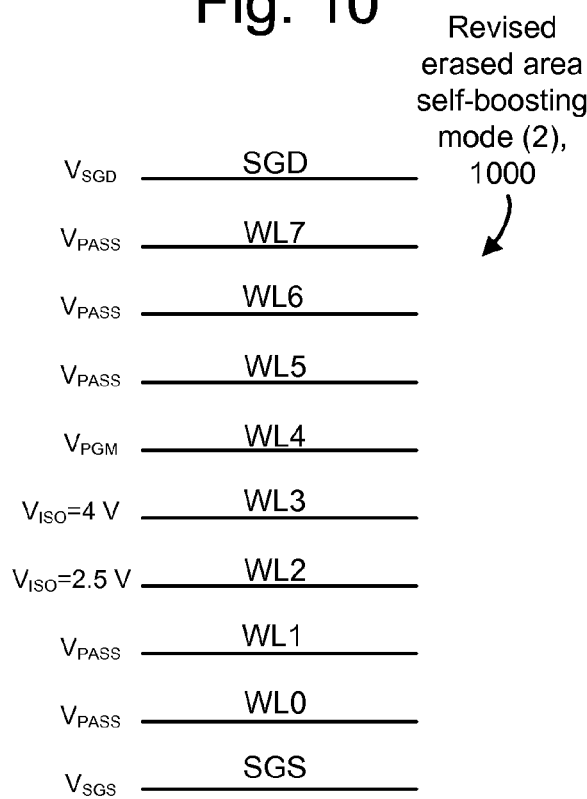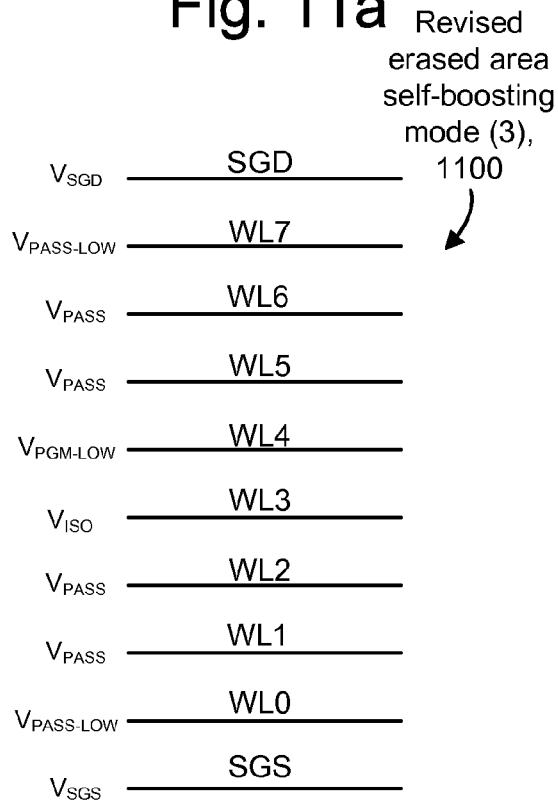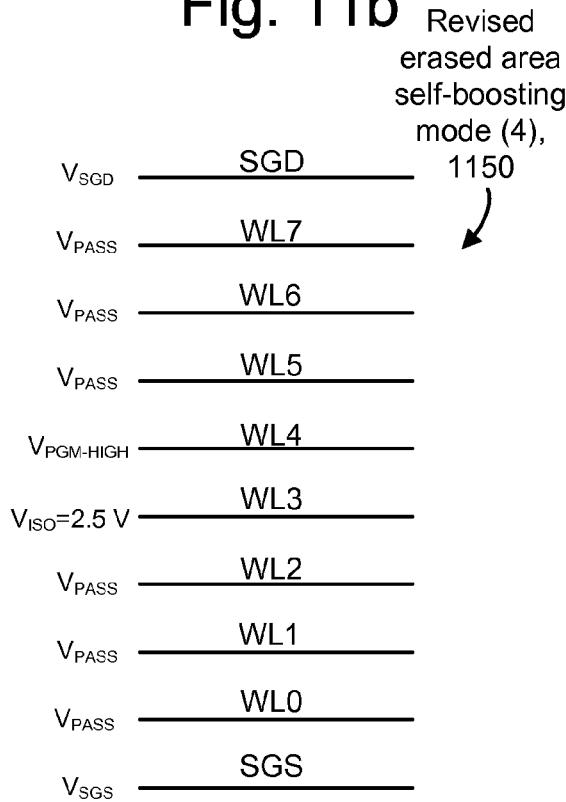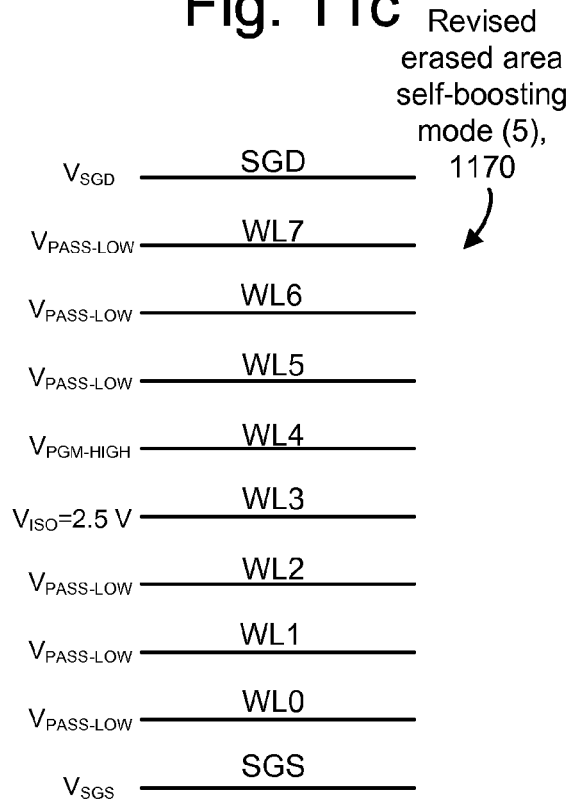

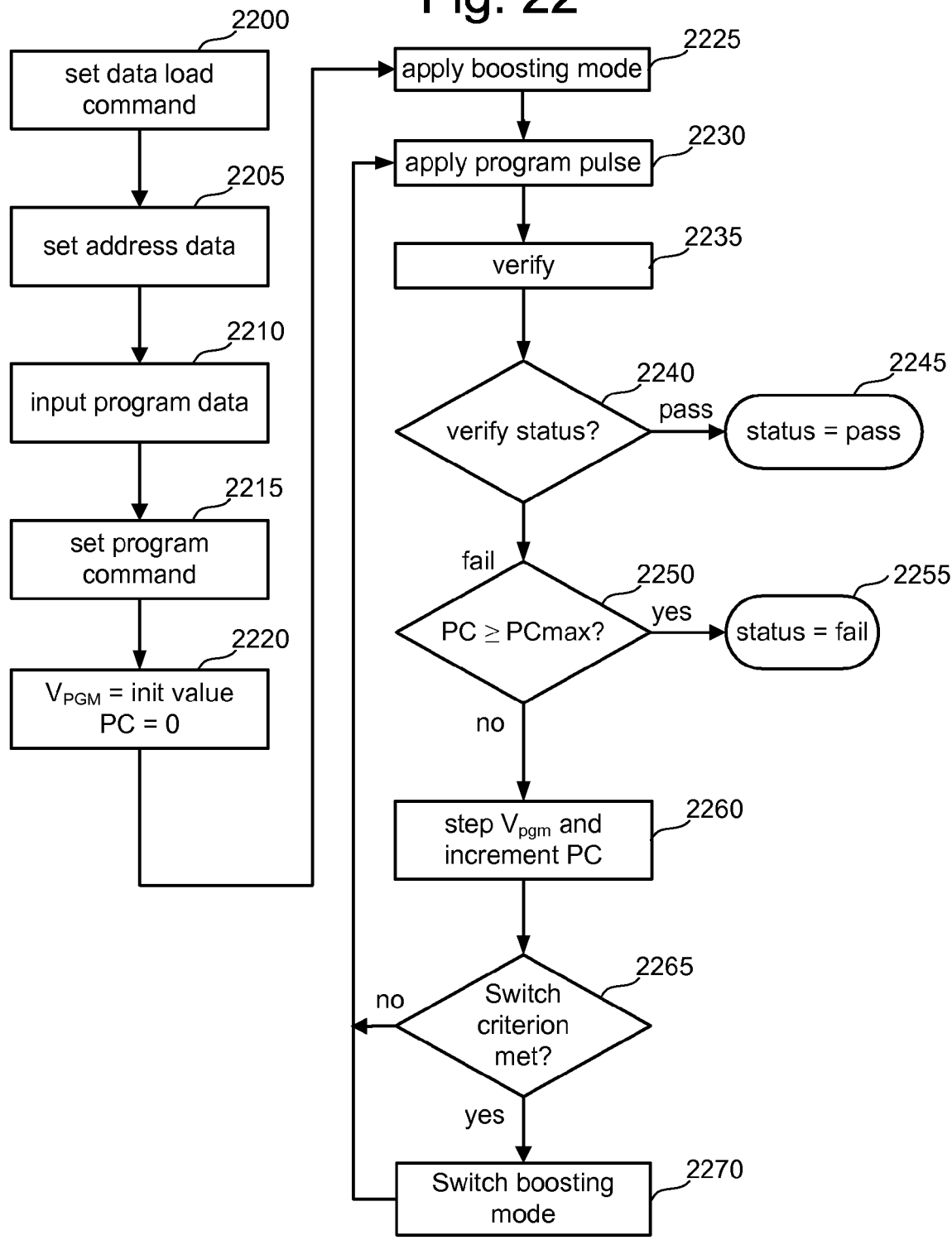

NON-VOLATILE MEMORY USING MULTIPLE BOOSTING MODES FOR REDUCED PROGRAM DISTURB

CROSS-REFERENCE TO RELATED APPLICATIONS

This application is a divisional of U.S. patent application Ser. No. 11/555,856, filed Nov. 2, 2006, published as US 2008/0123426 on May 29, 2008, now U.S. Pat. No. 7,468,911, and incorporated herein by reference.

This application is related to U.S. patent application Ser. No. 11/555,850, filed Nov. 2, 2006, published as US 2008/0123425 on May 29, 2008, now U.S. Pat. No. 7,440,323, and incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, various forms of program disturb have been experienced during programming due to the proximity of the non-volatile storage elements to one another. Moreover, this problem is expected to worsen with further scaling of NAND technology. Program disturb occurs when the threshold voltage of an unselected non-volatile storage element is shifted due to programming of other non-volatile storage elements. Various program disturb mechanisms can limit the available operating window for non-volatile storage devices such as NAND flash memory. Boosting techniques attempt to address this problem by boosting a channel area of a NAND string that is inhibited from programming to a high potential while connecting the channel area of a NAND string that contains a storage element to be programmed to a low potential such as 0 V. However, a given boosting mode cannot optimally address multiple failure mechanisms.

SUMMARY OF THE INVENTION

The present invention addresses the above and other issues by providing a non-volatile storage system which reduces program disturb.

In one embodiment, a non-volatile storage system includes a set of non-volatile storage elements, a number of word lines in communication with the set of non-volatile storage elements, where a storage element communicates with a selected word line, and one or more control circuits in communication with the set of non-volatile storage elements. The one or more control circuits program the storage element and during the programming, apply a first set of voltages to unselected word lines and switch, based on a boosting mode switching criterion, from applying the first set of voltages to applying a second set of voltages to the unselected word lines, where the first set of voltages varies from the second set of voltages, at least in part. For example, the programming can include applying a pulse train to the selected word line, where the boosting mode switching criterion is triggered when a program pulse of a specified amplitude in the pulse train is applied to the selected word line, or when a specified number of program pulses in the pulse train have been applied to the selected word line.

In another embodiment, a non-volatile storage system includes a set of non-volatile storage elements and one or more control circuits in communication with the set of non-volatile storage elements. The one or more control circuits implement a first boosting mode during a first programming phase in which programming of a storage element occurs, and implement a second boosting mode during a second programming phase in which programming of the storage element continues. A threshold voltage of the storage element is increased from a first level to a second level during the first programming phase, and from the second level to a third level during the second programming phase. Further, the first programming phase can include a first pass of a multi-pass programming technique and the second programming phase can include a second pass of the multi-pass programming technique.

In one approach, in the first programming phase, a first subset of pulses in a pulse train is applied to the storage element and, in the second programming phase, a second subset of pulses in the pulse train is applied to the storage element.

In another approach, in the first programming phase, a first pulse train is applied to the storage element and, in the second programming phase, a second pulse train is applied to the storage element.

In another embodiment, a non-volatile storage system includes a set of non-volatile storage elements, a number of word lines in communication with the set of non-volatile storage elements, where a storage element communicates with a selected word line and one or more control circuits in communication with the set of non-volatile storage elements. The one or more control circuits program the storage element by applying a pulse train to the selected word line, and during the programming, implement a first boosting mode for unselected non-volatile storage elements when a first subset of program pulses in the pulse train is applied to the selected word line, and switch from implementing the first boosting mode to implementing a second boosting mode for the unselected non-volatile storage elements when a second subset of program pulses in the pulse train is applied to the selected word line.

The set of non-volatile storage elements can be provided in a number of NAND strings, including a selected NAND string in which the storage element is provided, and an unselected NAND string, where the first and second boosting modes boost a channel of the unselected NAND string. Further, in one approach, the implementing of the first boosting mode includes boosting the channel without isolating a portion of the channel on a source-side of the NAND string from a portion of the channel on a drain-side of the NAND string, and the implementing of the second boosting mode includes isolating a portion of the channel on a source-side of the NAND string from a portion of the channel on a drain-side of the NAND string.

BRIEF DESCRIPTION OF THE DRAWINGS

FIG. 3 is a block diagram of an array of NAND flash storage elements.

FIG. 4 depicts a conceptual diagram showing a boost mode decision process.

FIG. 5 depicts a process for switching a boost mode during programming.

FIG. 6 depicts a self-boosting mode implemented via a plurality of word lines.

FIG. 7 depicts a local self-boosting mode implemented via a plurality of word lines.

FIG. 8 depicts an erased area self-boosting mode implemented via a plurality of word lines.

FIG. 9 depicts a first revised erased area self-boosting mode implemented via a plurality of word lines.

FIG. 10 depicts a second revised erased area self-boosting mode implemented via a plurality of word lines.

FIG. 11a depicts a third revised erased area self-boosting mode implemented via a plurality of word lines.

FIG. 11b depicts a fourth revised erased area self-boosting mode implemented via a plurality of word lines.

FIG. 11c depicts a fifth revised erased area self-boosting mode implemented via a plurality of word lines.

FIG. 22 is a flow chart describing one embodiment of a process for programming non-volatile memory.

DETAILED DESCRIPTION

The present invention provides a non-volatile storage system and method which reduce program disturb.

Figure 1:
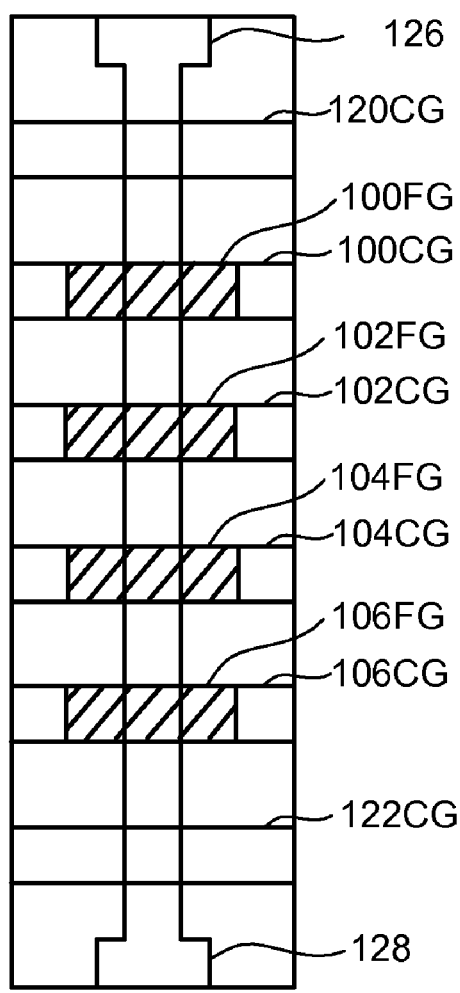
FIG. 1 is a top view of a NAND string.
Figure 2:
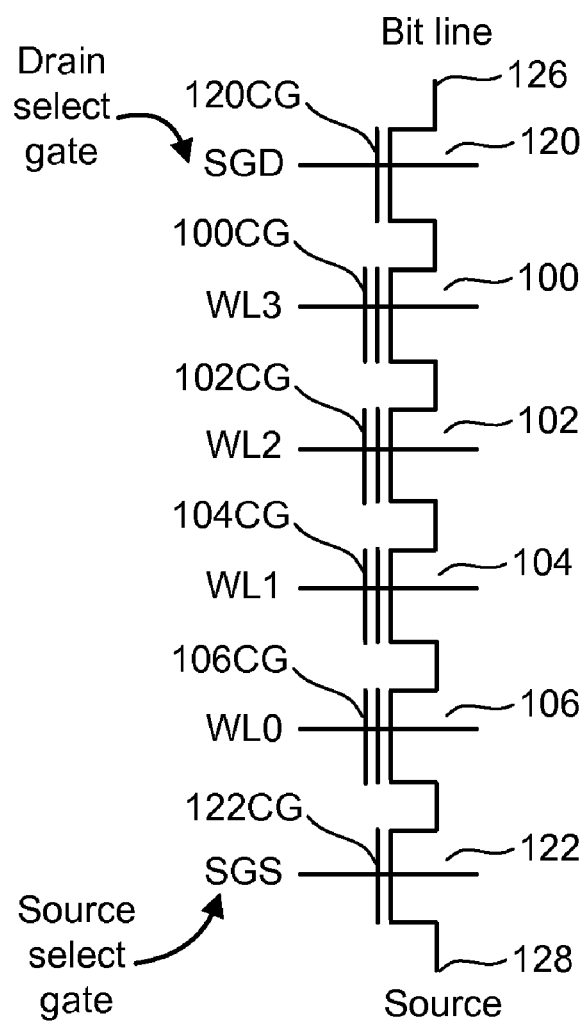
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the charge stored in a programmed storage element due to capacitive coupling between storage elements, can also be problematic.

FIG. 4 depicts a conceptual diagram showing a boost mode decision process. As mentioned at the outset, program disturb remains a significant problem in non-volatile storage systems. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory. For example, boosting techniques attempt to address this problem by boosting a channel area of an inhibited NAND string to a high potential while connecting the channel area of a NAND string that contains a storage element to be programmed to a low potential such as 0 V. However, a given boosting mode cannot optimally address multiple failure mechanisms. That is, a given boosting mode may effectively address a specific program disturb failure mechanism but may be ineffective in addressing other failure mechanisms. Typically, a compromise or optimization of the boosting mode is made to give the best operating window. Here, we propose using different boosting modes during programming to better optimize the boosting. For example, in one approach, one boosting mode is used during initial programming and a second boosting mode is used near the end of programming a single page or word line to improve the overall margin against program disturb.

Various criteria can be used to decide which boosting mode to use, and when to switch from one boosting mode to another. As an example, three different boosting modes, indicated at blocks 400, 405 and 410, can be selected by a boost mode decision process (block 415). Boosting modes include, e.g., self-boosting (SB), local self-boosting (LSB), erased area self-boosting (EASB) and revised erased area self-boosting (REASB), discussed further below. Once a decision is made, the selected boost mode is applied (block 420), e.g., by applying a set of voltages to the unselected word lines which corresponds to the selected boosting mode. For example, one or more boost mode switch criterion (block 425) can be used by the boost mode switch decision process (block 415). These criterion can include a program pulse number (block 430), a program pulse amplitude (block 435), a program pass number (block 440), a position of a selected word line (block 445), a coarse/fine programming mode status (block 450), whether a storage element reaches a program condition (block 455), and a number of program cycles experienced by a memory device (block 460).

The program pass number may indicate, e.g., whether the first or second pass of a multi-pass programming process is in progress. The criterion regarding whether a storage element reaches a program condition may be implemented, e.g., by detecting when a first storage element, or portion of storage elements, in a group of storage elements, such as a block or array, reaches a verify condition. The switching to a different boosting mode can occur when the verify condition is reached. The criterion regarding the number of program cycles experienced by a memory device can be implemented, e.g., by tracking the number of program cycles and adjusting a switch point based thereon. For example, if a switch point occurs during a pulse train, the switch point can occur relatively sooner in the pulse train after the memory device has experienced relatively more cycles since the storage elements tend to program faster as they undergo additional programming cycles. The boost mode switch criteria are described in further detail below.

FIG. 5 depicts a process for switching a boost mode during programming. The conceptual diagram presented above can be understood further in terms of a flowchart. At step 500, programming begins and at step 510, a first boosting mode is applied. At decision step 520, if a switch criterion is met, there is a switch to a second boosting mode (step 530) and programming continues (step 540) until it is completed (step 550). If the switch criterion is not met at decision step 520, the first boosting mode continues to be applied and programming continues (step 525). Generally, a boosting mode is implemented by configuring one or more control circuits of a memory device to apply appropriate voltages to word lines which are in communication with a set of storage elements.

A decision to switch boosting modes can be based on a number of factors. Generally, it is desirable to implement a boosting mode which is optimal for the current programming scheme and the current condition of the storage elements and NAND strings. For instance, the non-EASB boosting modes, such as SB or LSB, can be relatively more effective for the initial program pulses, when $V_{PGM}$ is low, while the EASB boosting modes, including REASB, can be relatively more effective for the higher program pulses, when $V_{PGM}$ is high. In this case, a switch from the non-EASB mode to the EASB mode can be made based on the amplitude of $V_{PGM}$. Further, a failure mode may be responsive to a number of program pulses, aside from the program pulse amplitude. In this case, a switch from the non-EASB mode to the EASB mode can be made based on the number of program pulses (which in turn often correlates with $V_{PGM}$). Moreover, certain boosting modes may be more advantageous based on the position of a selected word line among the other word lines. Generally, depending on the characteristics of a given non-volatile storage device, an operating window can be defined using multiple boosting modes which yields an acceptably low fail rate.

FIG. 6 depicts a self-boosting mode implemented via a plurality of word lines. As mentioned, various types of boosting modes have been developed to combat program disturb. During programming of storage elements on a selected word line, the boosting modes are implemented by applying a set of voltages to unselected word lines which are in communication with storage elements which are not currently being programmed. The storage elements which are being programmed are associated with selected NAND strings while other storage elements are associated with unselected NAND strings. Program disturb generally involves storage elements in the unselected NAND strings but can also occur for other storage elements in the same NAND strings.

In one approach, the self-boosting mode is depicted by example word lines 600 which communicate with a set of storage elements arranged in NAND strings. In this example, there are eight word lines, e.g., control lines, labeled WL0 through WL7, a source-side select gate control line labeled SGS and a drain-side select gate control line labeled SGD. A set of voltages which is applied to the control lines is also depicted. WL4 is designated as the selected word line as an illustration. Programming typically proceeds one word line at a time, from the source-side to the drain side of a NAND string. The voltages which are applied include $V_{SGS}$, which is applied to the source-side select gate control line SGS, a pass voltage, $V_{PASS}$, which is applied to each of the unselected word lines, WL0-WL3 and WL5-WL7, a program voltage, $V_{PGM}$, which is applied to the selected word line WL4, and $V_{SGD}$, which is applied via the drain-side select gate control line SGD. Typically, $V_{SGS}$ is 0 V so that the source-side select gate is off. $V_{SGD}$ is about 2.5 V so that the drain-side select gate is on for the selected NAND strings, due to application of a corresponding low bit line voltage $V_{BL}$ such as 0-1 V. The drain-side select gate is off for the unselected NAND strings, due to application of a corresponding higher $V_{BL}$ such as 1.5-3 V.

Additionally, $V_{PASS}$ can be about 7-10 V and $V_{PGM}$ can vary from about 12-20 V. In one programming scheme, a pulse train of program voltages is applied to the selected word line. See also FIGS. 23 and 24. The amplitude of each successive program pulse in the pulse train increases in a staircase manner, typically by about 0.3-0.5 V per pulse. Further, verify pulses can be applied between program pulses to verify whether the selected storage elements have reached a target programming condition. Note also that each individual program pulse can have a fixed amplitude, or can have a varying amplitude. For example, some programming schemes apply a pulse with an amplitude which varies like a ramp or staircase. Any type of program pulse can be used.

With WL4 as the programmed word line, and programming proceeding from the source-side to the drain side of each NAND string, the storage elements associated with WL0-WL3 will have already been programmed and the storage elements associated with WL5-WL7 will be erased when the storage elements on WL4 are being programmed. The pass voltages on the unselected word lines couple to the channels associated with the unselected NAND strings, causing a voltage to exist in the channels which tends to reduce program disturb by lowering the voltage across the tunnel oxide of the storage elements.

FIG. 7 depicts a local self-boosting (LSB) mode implemented via a plurality of word lines. In one approach, the local self-boosting mode is depicted by example word lines 700 which communicate with a set of storage elements arranged in NAND strings. Local self-boosting varies from the self-boosting mode of FIG. 6 in that the word lines which are adjacent to the selected word line receive an isolation voltage, $V_{ISO}$, of 0 V or another voltage close to 0 V, rather than $V_{PASS}$. The remaining unselected word lines are at $V_{PASS}$. Local self-boosting attempts to reduce program disturb by isolating the channel of previously programmed storage elements from the channel of the storage elements being inhibited. While the LSB mode is effective for lower values of $V_{PGM}$, a disadvantage of the LSB mode is that the boosted channel voltage under the selected word line can be very high when $V_{PGM}$ is high, as that part of the channel is isolated from the other channel areas under the unselected word lines. Thus, the boosting voltage is mainly determined by the high programming voltage, $V_{PGM}$. Due to the high boosting, band-to-band tunneling or Gate Induced Drain Leakage (GIDL) near the word lines that are biased to 0 V can occur. The amount of channel boosting can be limited to a lower value by using the erased area self-boosting (EASB) or revised EASB (REASB) modes, discussed below.

FIG. 8 depicts an erased area self-boosting mode implemented via a plurality of word lines. In one approach, the EASB mode is depicted by example word lines 800 which communicate with a set of storage elements arranged in NAND strings. EASB is similar to LSB with the exception that only the source-side neighbor word line, WL3, is at the isolation voltage, $V_{ISO}$=0 V, so that the boosted channels on the source and drain sides of the unselected NAND strings are isolated. The channel area under the selected word line and the channel area at the drain side of the selected storage elements are connected so that the channel boosting is determined mainly by $V_{PASS}$ which is applied to the unselected word lines instead of by $V_{PGM}$. See also FIG. 13. The drain-side neighbor word line, WL5, is at $V_{PGM}$. If $V_{PASS}$ is too low, boosting in the channel will be insufficient to prevent program disturb. However, if $V_{PASS}$ is too high, unselected word lines in a selected NAND string (with 0 V on the bit line) may be programmed, or program disturb due to GIDL may occur.

FIG. 9 depicts a first revised erased area self-boosting mode implemented via a plurality of word lines. In one approach, the first REASB mode is depicted by example word lines 900 which communicate with a set of storage elements arranged in NAND strings. REASB is similar to EASB but applies a small isolation voltage, $V_{ISO}$, such as 2.5 V to an adjacent isolation word line, e.g., WL3.

FIG. 10 depicts a second revised erased area self-boosting mode implemented via a plurality of word lines. In one approach, the second REASB mode is depicted by example word lines 1000 which communicate with a set of storage elements arranged in NAND strings. In this case, $V_{ISO}$ is applied to multiple word lines, such as WL2 and WL3, which are on the source side of the selected word line, WL4. The same $V_{ISO}$ or different $V_{ISO}$ values can be used. For example, $V_{ISO}$ may decrease in a gradual manner, e.g., from 4 V on WL3 to 2.5 V on WL2. Various other approaches can be used as well. For example, $V_{ISO}$ may be applied on three adjacent word lines (e.g., WL1-WL3) in which case the last word line (WL1) receives the lowest $V_{ISO}$ and WL2 and WL3 receive a common $V_{ISO}$.

FIG. 11a depicts a third revised erased area self-boosting mode implemented via a plurality of word lines. In one approach, the third REASB mode is depicted by example word lines 1100 which communicate with a set of storage elements arranged in NAND strings. In this case, a relatively low pass voltage, represented by $V_{PASS-LOW}$, is applied to one or both of the end word lines, e.g., WL0 and WL7, when $V_{PGM}$ has a relatively low value, represented by $V_{PGM-LOW}$, while the usual, higher $V_{PASS}$ is applied to the other unselected word lines. For instance, if $V_{PGM}$ varies from 12-20 V, $V_{PGM-LOW}$ may represent the range of 12-16 V. This boosting mode can address a program disturb mechanism which affects the end word lines. Specifically, if the same value of $V_{PASS}$ is applied to all of the unselected word lines, including the end word lines, leakage or GIDL can occur on the select gates due to a slow rate of electron injection into the storage elements associated with the end word lines. The boosting mode depicted can address this problem.

Further, when $V_{PGM}$ is in a higher range, represented by $V_{PGM-HIGH}$, e.g., in the range of 16-20 V, the pass voltage on the end word lines can be elevated back to the level of the other unselected word lines, e.g., to $V_{PASS}$, as depicted in FIG. 11b. Or, the pass voltage for the end word lines can be elevated to an intermediate level $V_{PASS-INT}$ which is less than $V_{PASS}$ but greater than $V_{PASS-LOW}$.

FIG. 11b depicts a fourth revised erased area self-boosting mode implemented via a plurality of word lines. In one approach, the fourth REASB mode is depicted by example word lines 1150 which communicate with a set of storage elements arranged in NAND strings. Here, the pass voltage on the end word lines, WL0 and WL7, is elevated back to the level of the other unselected word lines, e.g., to $V_{PASS}$, when $V_{PGM}$ on the selected word line, WL4, is in a higher range of values, represented by $V_{PGM-HIGH}$.

Further, a different boosting mode may be implemented based on the position of the selected word line. For instance, when a boost mode switch occurs during a pulse train, the switch can occur at a location in the pulse train which is based on the relative location of the selected word line. In one approach, a switch from SB or LSB to EASB or REASB occurs relatively later in the pulse train when the position of the selected word line is relatively closer to a drain side of the unselected NAND string.

FIG. 11c depicts a fifth revised erased area self-boosting mode implemented via a plurality of word lines. In one approach, the fifth REASB mode is depicted by example word lines 1170 which communicate with a set of storage elements arranged in NAND strings. This boosting mode is analogous to that of FIG. 11a but a lower $V_{PASS}$, $V_{PASS-LOW}$, is used for each of the unselected word lines when $V_{PGM}$ is in a low range, represented by $V_{PGM-LOW}$. This mode may be followed by the boosting mode of FIG. 11b when $V_{PGM}$ reaches the high range, represented by $V_{PGM-HIGH}$. Various other combinations may be used as well. For example, $V_{PASS}$ for the unselected word lines other than the end word lines may be higher than $V_{PASS}$ for the end word lines, regardless of $V_{PGM}$. Further, there may be more than two ranges of $V_{PGM}$ which trigger a change in the boosting mode.

Figure 12:
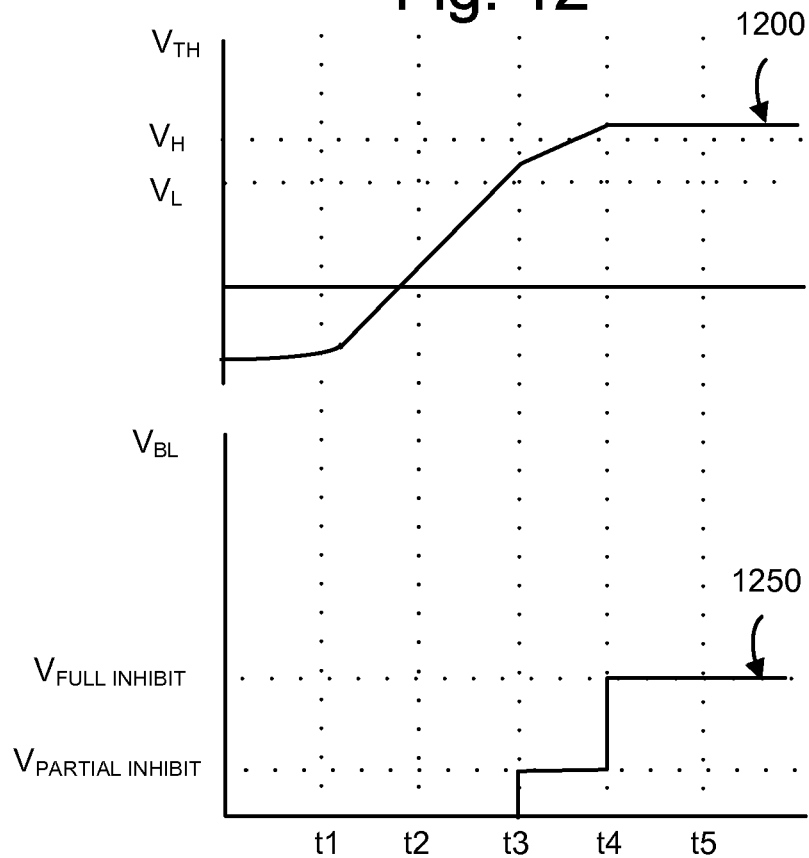
FIG. 12 depicts a time line showing how coarse and fine programming are achieved by setting a bit line inhibit voltage.

FIG. 12 depicts a time line showing how coarse and fine programming are achieved by setting a bit line inhibit voltage.

As mentioned, a switch in the boost mode can occur based on a coarse/fine mode programming status. Coarse/fine programming allows the threshold voltage ($V_{TH}$) of a storage element to increase to a desired level more quickly at first, during coarse programming, and then more slowly, during fine programming. To this end, lower and higher verify levels, $V_L$ and $V_H$, respectively, may be used for a given programming state. In particular, coarse programming occurs when the voltage threshold is below $V_L$, while fine programming occurs when the voltage threshold is between $V_L$ and $V_H$. Coarse/fine programming can provide tightened voltage distributions for programmed storage elements. See also FIG. 21d.

The curve 1200 indicates a change in a storage element's $V_{TH}$ with time, while the curve 1250 indicates a bit line voltage ($V_{BL}$) that is applied to the bit line associated with the storage element. Programming of the storage element can be slowed down by providing a bit line inhibit voltage, $V_{PARTIAL\ INHIBIT}$, which counteracts the effect of the applied programming voltage pulses. When $V_{TH}$ exceeds $V_H$, $V_{FULL\ INHIBIT}$ is applied on the bit line to place the storage element in an inhibit mode in which it is locked out from further programming and verifying. Different $V_L$ and $V_H$ values can be associated with different states of a multi-state storage element, e.g., states A, B and C, to allow coarse/fine programming of the different states. The inhibit voltage slows programming and thereby allows more precise control of the programmed voltage threshold level. In one approach, the $V_{PARTIAL\ INHIBIT}$, typically 0.5-1.0 V, reduces the electric field across the oxide, and is passed to the NAND string during programming. This requires the select gate voltage to be high enough to pass this voltage, typically 2.5 V. Moreover, a reduced step size in the $V_{PGM}$ pulse train can also be used to provide a fine programming mode. This can be done with or without an inhibit voltage on the bit line.

Thus, in one approach, coarse/fine programming can be used when applying a single pulse train of program pulses to a selected word line by switching from the coarse programming mode to the fine programming mode when it is determined that some number of storage elements, e.g., one or more, has reached a lower verify level. Further, coarse/fine programming can be used in multi-pass programming scheme in which storage elements are programmed in a first pass, using coarse programming, to an interim program condition which is close to a final program condition, and in a second pass, using fine programming, from the interim program condition to the final program condition. Multi-pass programming can also employ different ranges of $V_{PGM}$. For example, the range of $V_{PGM}$ can be reduced, e.g., from 12-20 V in the first pass, when coarse programming is used, to 14-20 V in the second pass, when fine programming is used.

Figure 13:
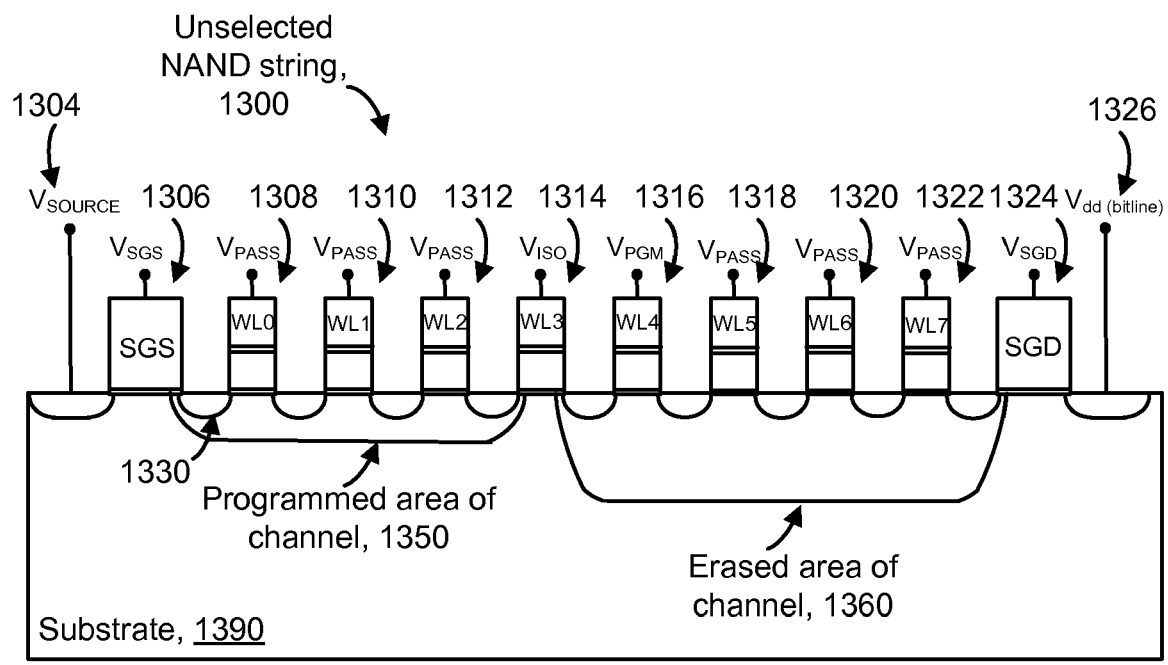
FIG. 13 depicts a cross-sectional view of an unselected NAND string showing programmed and erased areas.

FIG. 13 depicts a cross-sectional view of an unselected NAND string showing programmed and erased areas with EASB, such as depicted in FIG. 8, or REASB, such as depicted in FIG. 9. The view is simplified and not to scale. The NAND string 1300 includes a source-side select gate 1306, a drain-side select gate 1324, and eight storage elements 1308, 1310, 1312, 1314, 1316, 1318, 1320 and 1322, formed on a substrate 1390. The components can be formed on n-well region which is on a p-well region of the substrate. A source supply line 1304 with a potential of $V_{SOURCE}$ is provided in addition to a bit line 1326 with a potential of Vdd (bit line). During programming, $V_{PGM}$ is provided on a selected word line, in this case, WL4, which is associated with storage element 1316. Further, recall that the control gate of a storage element may be provided as a portion of the word line. For example, WL0, WL1, WL2, WL3, WL4, WL5, WL6 and WL7 can extend via the control gates of storage elements 1308, 1310, 1312, 1314, 1316, 1318, 1320 and 1322, respectively. $V_{ISO}$ is applied to the source-side word line (WL3, referred to as an isolation word line) of the selected word line. $V_{PASS}$ is applied to the remaining word lines associated with NAND string 1300. $V_{SGS}$ is applied to the select gate 1306 and $V_{SGD}$ is applied to the select gate 1324.

Assuming programming of storage elements along the NAND string 1300 progresses from storage element 1308 to storage element 1322, when storage elements associated with WL4 in other NAND strings are being programmed, storage elements 1308-1314 will already have been programmed, and storage elements 1318-1322 will not yet have been programmed. Note that storage element 1316 is not programmed when the NAND string 1300 is inhibited. Thus, all or some of storage elements 1308-1314 will have electrons programmed into and stored in their respective floating gates, and storage elements 1318-1322 can be erased or partially programmed, depending on the programming mode. For example, the storage elements 1318-1322 may have been previously programmed in the first step of a two-step programming technique.

Further, with the EASB or REASB boosting mode, a sufficiently low isolation voltage, $V_{ISO}$, is applied to the source-side neighbor of the selected word line to isolate programmed and erased channel areas in the substrate. That is, a portion of the channel of the substrate on a source-side or programmed side of the unselected NAND string, e.g., area 1350, is isolated from a portion of the channel on a drain-side or unprogrammed side, e.g., area 1360, of the unselected NAND string. The channel area 1350 is boosted by the application of $V_{PASS}$ on WL0-WL2, while the channel area 1360 is boosted by the application of $V_{PGM}$ on WL4 and $V_{PASS}$ on WL5-WL7. Since $V_{PGM}$ dominates, the erased area 1360 will experience relatively higher boosting than programmed area 1350.

Figure 14:
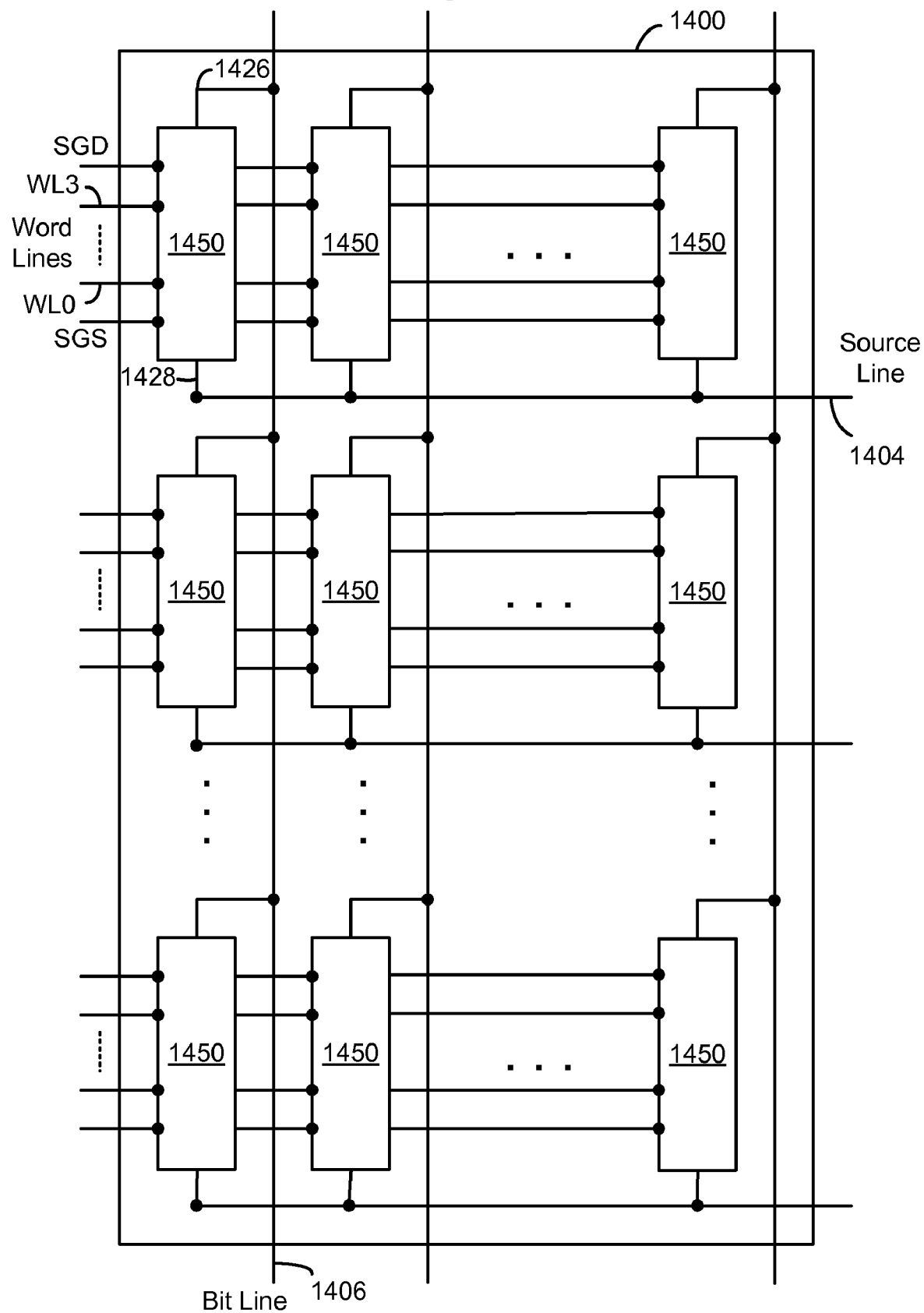
FIG. 14 is a block diagram of an array of NAND flash storage elements.

FIG. 14 illustrates an example of an array 1400 of NAND storage elements, such as those shown in FIGS. 1 and 2. Along each column, a bit line 1406 is coupled to the drain terminal 1426 of the drain select gate for the NAND string 1450. Along each row of NAND strings, a source line 1404 may connect all the source terminals 1428 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 15:
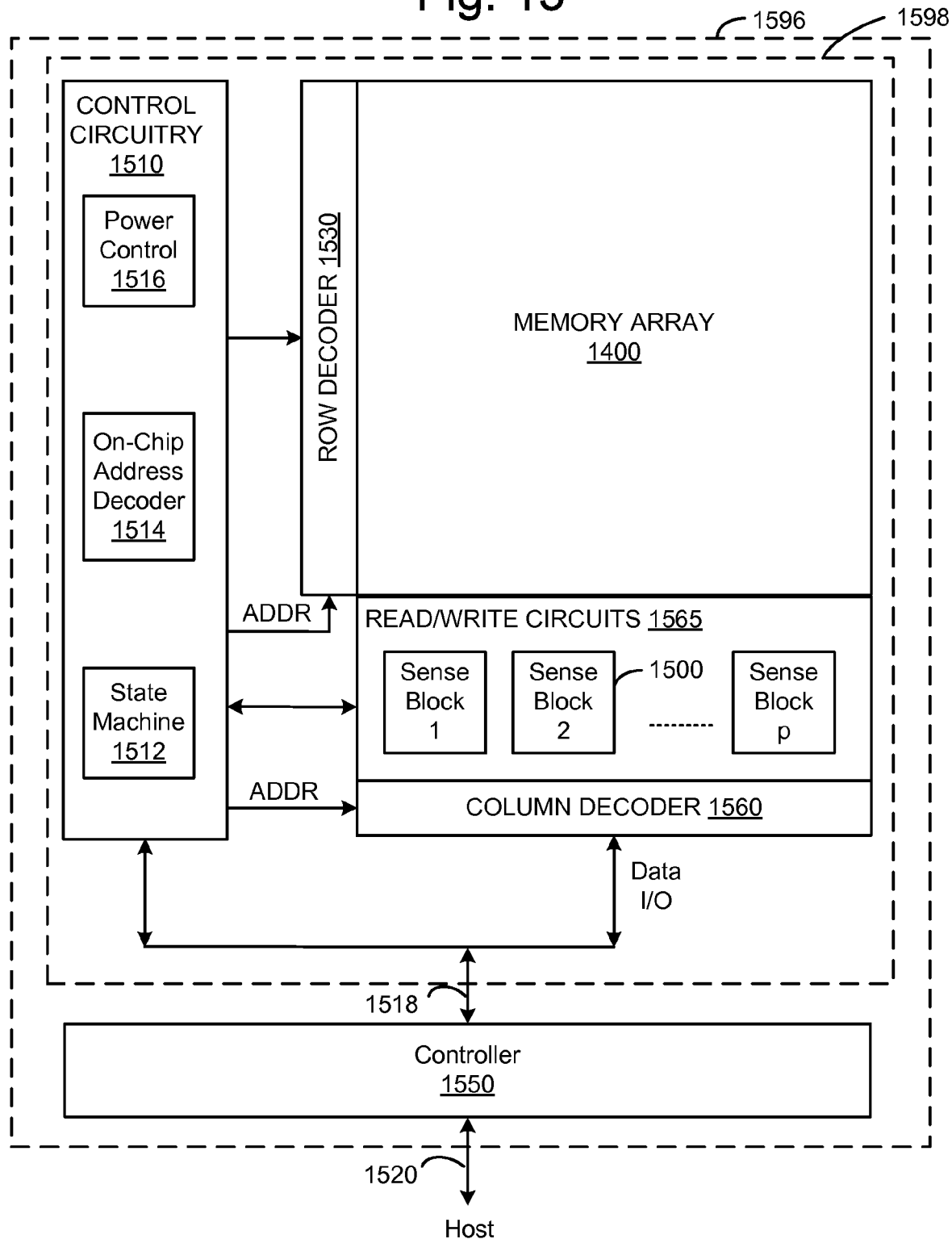
FIG. 15 is a block diagram of a non-volatile memory system using single row/column decoders and read/write circuits.

FIG. 15 is a block diagram of a non-volatile memory system using single row/column decoders and read/write circuits. The diagram illustrates a memory device 1596 having read/write circuits for reading and programming a page of storage elements in parallel, according to one embodiment of the present invention. Memory device 1596 may include one or more memory die 1598. Memory die 1598 includes a two-dimensional array of storage elements 1400, control circuitry 1510, and read/write circuits 1565. In some embodiments, the array of storage elements can be three dimensional. The memory array 1400 is addressable by word lines via a row decoder 1530 and by bit lines via a column decoder 1560. The read/write circuits 1565 include multiple sense blocks 1500 and allow a page of storage elements to be read or programmed in parallel. Typically a controller 1550 is included in the same memory device 1596 (e.g., a removable storage card) as the one or more memory die 1598. Commands and Data are transferred between the host and controller 1550 via lines 1520 and between the controller and the one or more memory die 1598 via lines 1518.

The control circuitry 1510 cooperates with the read/write circuits 1565 to perform memory operations on the memory array 1400. The control circuitry 1510 includes a state machine 1512, an on-chip address decoder 1514 and a power control module 1516. The state machine 1512 provides chip-level control of memory operations. The on-chip address decoder 1514 provides an address interface between that used by the host or a memory controller to the hardware address used by the decoders 1530 and 1560. The power control module 1516 controls the power and voltages supplied to the word lines and bit lines during memory operations.

In some implementations, some of the components of FIG. 15 can be combined. In various designs, one or more of the components (alone or in combination), other than storage element array 1400, can be thought of as a managing circuit. For example, one or more managing circuits may include any one of or a combination of control circuitry 1510, state machine 1512, decoders 1514/1560, power control 1516, sense blocks 1500, read/write circuits 1565, controller 1550, etc.

Figure 16:
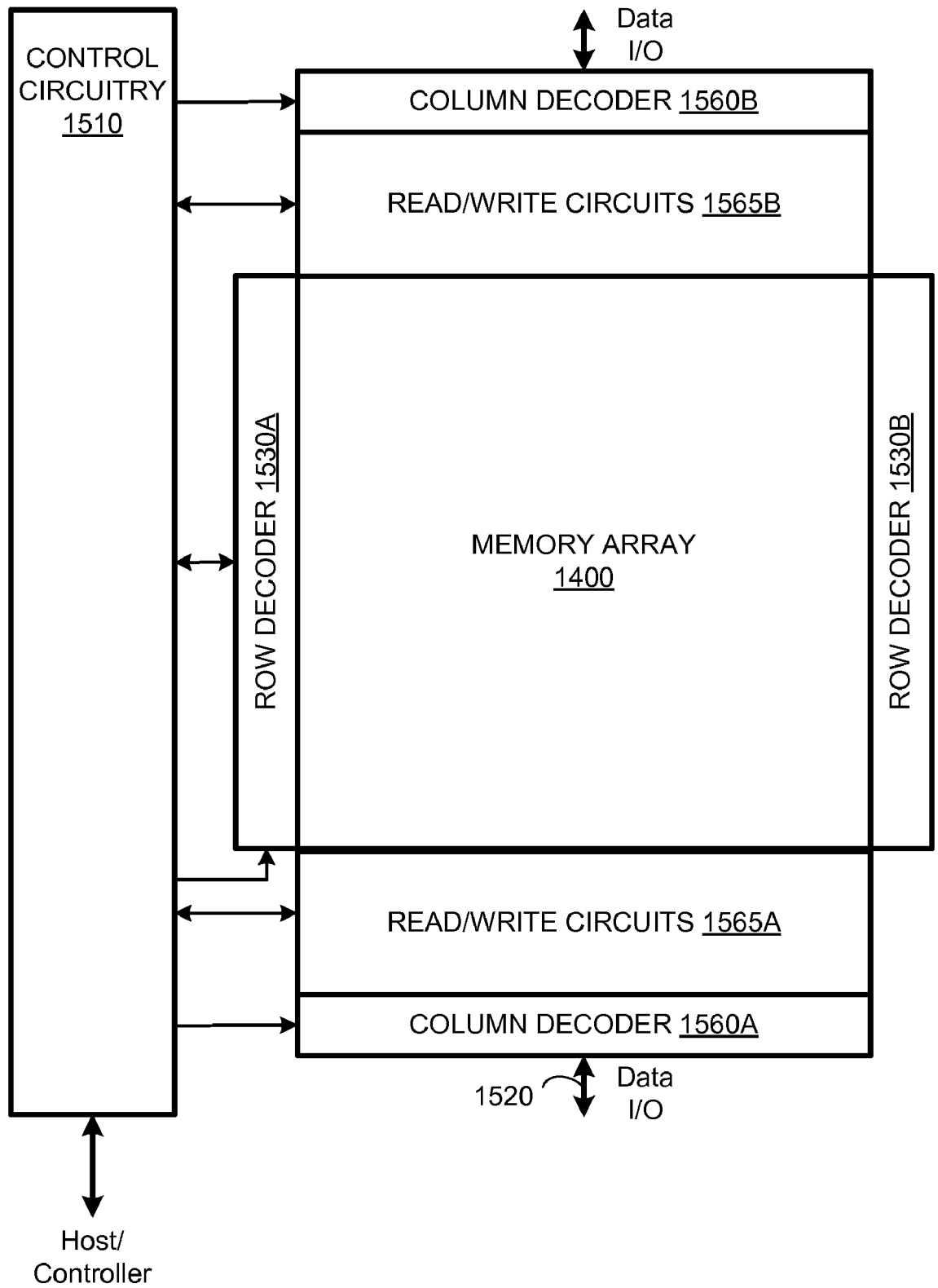
FIG. 16 is a block diagram of a non-volatile memory system using dual row/column decoders and read/write circuits.

FIG. 16 is a block diagram of a non-volatile memory system using dual row/column decoders and read/write circuits. Here, another arrangement of the memory device 1596 shown in FIG. 15 is provided. Access to the memory array 1400 by the various peripheral circuits is implemented in a symmetric fashion, on opposite sides of the array, so that the densities of access lines and circuitry on each side are reduced by half. Thus, the row decoder is split into row decoders 1530A and 1530B and the column decoder into column decoders 1560A and 1560B. Similarly, the read/write circuits are split into read/write circuits 1565A connecting to bit lines from the bottom and read/write circuits 1565B connecting to bit lines from the top of the array 1400. In this way, the density of the read/write modules is essentially reduced by one half. The device of FIG. 16 can also include a controller, as described above for the device of FIG. 15.

Figure 17:
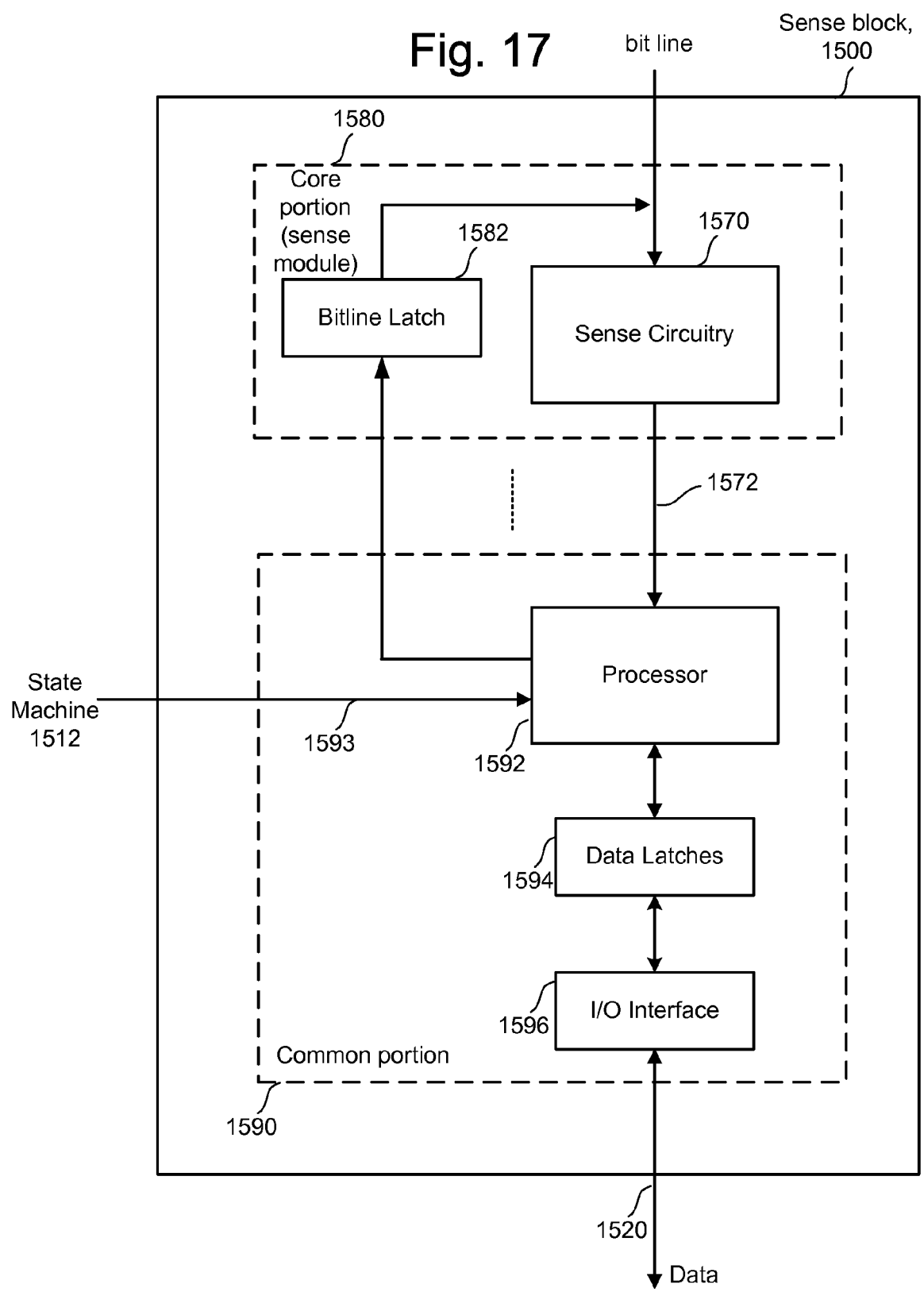
FIG. 17 is a block diagram depicting one embodiment of a sense block.

FIG. 17 is a block diagram depicting one embodiment of a sense block. An individual sense block 1500 is partitioned into a core portion, referred to as a sense module 1580, and a common portion 1590. In one embodiment, there will be a separate sense module 1580 for each bit line and one common portion 1590 for a set of multiple sense modules 1580. In one example, a sense block will include one common portion 1590 and eight sense modules 1580. Each of the sense modules in a group will communicate with the associated common portion via a data bus 1572. For further details refer to U.S. Patent Application Pub No. 2006/0140007, titled "Non-Volatile Memory & Method with Shared Processing for an Aggregate of Sense Amplifiers" published Jun. 29, 2006, and incorporated herein by reference in its entirety.

Sense module 1580 comprises sense circuitry 1570 that determines whether a conduction current in a connected bit line is above or below a predetermined threshold level. Sense module 1580 also includes a bit line latch 1582 that is used to set a voltage condition on the connected bit line. For example, a predetermined state latched in bit line latch 1582 will result in the connected bit line being pulled to a state designating program inhibit (e.g., Vdd).

Common portion 1590 comprises a processor 1592, a set of data latches 1594 and an I/O Interface 1596 coupled between the set of data latches 1594 and data bus 1520. Processor 1592 performs computations. For example, one of its functions is to determine the data stored in the sensed storage element and store the determined data in the set of data latches. The set of data latches 1594 is used to store data bits determined by processor 1592 during a read operation. It is also used to store data bits imported from the data bus 1520 during a program operation. The imported data bits represent write data meant to be programmed into the memory. I/O interface 1596 provides an interface between data latches 1594 and the data bus 1520.

During read or sensing, the operation of the system is under the control of state machine 1512 that controls the supply of different control gate voltages to the addressed storage element. As it steps through the various predefined control gate voltages corresponding to the various memory states supported by the memory, the sense module 1580 may trip at one of these voltages and an output will be provided from sense module 1580 to processor 1592 via bus 1572. At that point, processor 1592 determines the resultant memory state by consideration of the tripping event(s) of the sense module and the information about the applied control gate voltage from the state machine via input lines 1593. It then computes a binary encoding for the memory state and stores the resultant data bits into data latches 1594. In another embodiment of the core portion, bit line latch 1582 serves double duty, both as a latch for latching the output of the sense module 1580 and also as a bit line latch as described above.

It is anticipated that some implementations will include multiple processors 1592. In one embodiment, each processor 1592 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1594 from the data bus 1520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1592 monitors the read back memory state relative to the desired memory state. When the two are in agreement, the processor 1592 sets the bit line latch 1582 so as to cause the bit line to be pulled to a state designating program inhibit. This inhibits the storage element coupled to the bit line from further programming even if programming pulses appear on its control gate. In other embodiments the processor initially loads the bit line latch 1582 and the sense circuitry sets it to an inhibit value during the verify process.

Data latch stack 1594 contains a stack of data latches corresponding to the sense module. In one embodiment, there are three data latches per sense module 1580. In some implementations (but not required), the data latches are implemented as a shift register so that the parallel data stored therein is converted to serial data for data bus 1520, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Pat. No. 7,046,568, titled "Improved Memory Sensing Circuit And Method For Low Voltage Operation," (4) U.S. Pat. No. 7,196,928, titled "Compensating for Coupling During Read Operations of Non-Volatile Memory," and (5) U.S. Pat. No. 7,327,619, titled "Reference Sense Amplifier For Non-Volatile Memory. All five of the immediately above-listed patent documents are incorporated herein by reference in their entirety.

Figure 18:
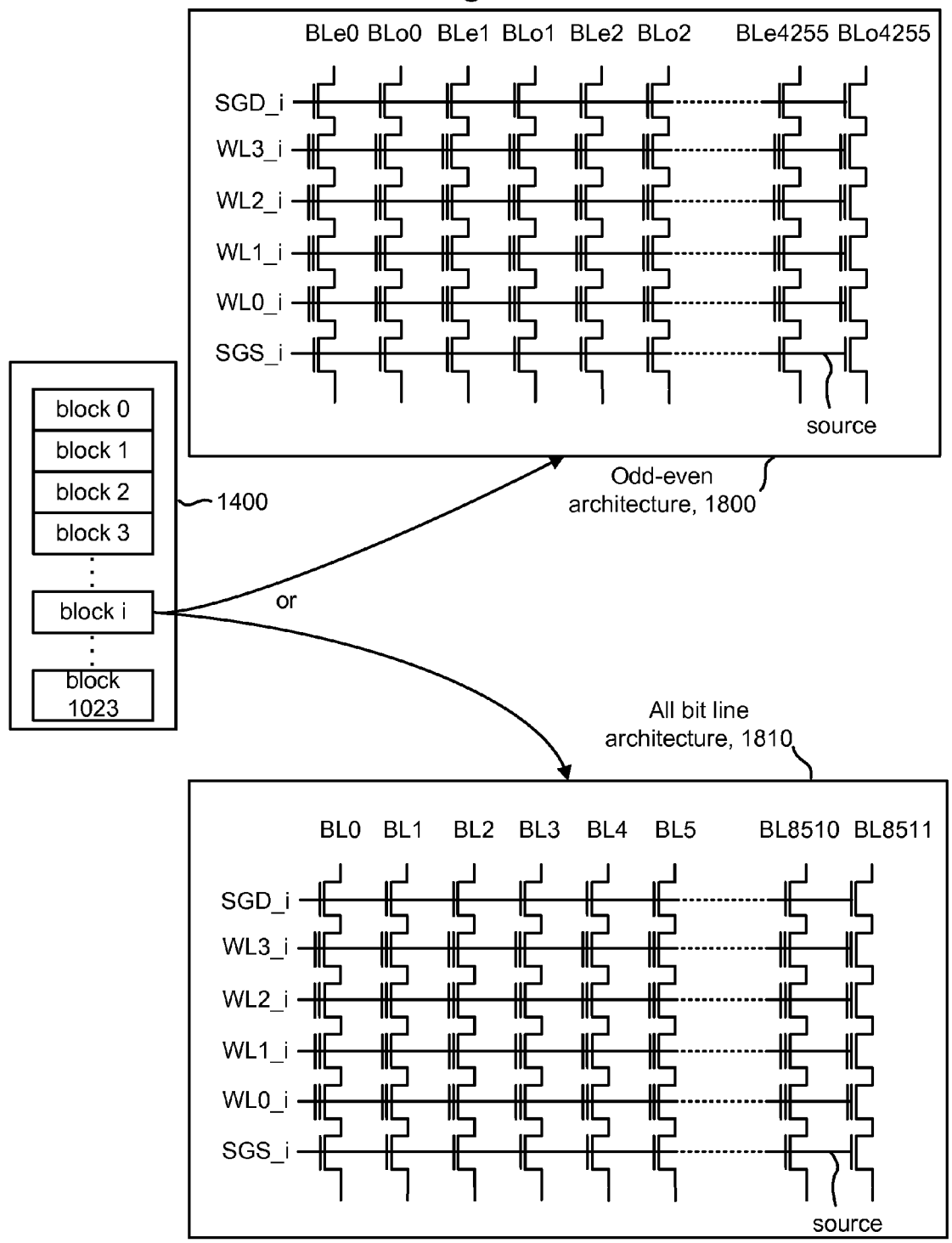
FIG. 18 illustrates an example of an organization of a memory array into blocks for an all bit line memory architecture or for an odd-even memory architecture.

FIG. 18 illustrates an example of an organization of a memory array into blocks for an all bit line memory architecture or for an odd-even memory architecture. Exemplary structures of storage element array 1400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1810), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1800), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 19:
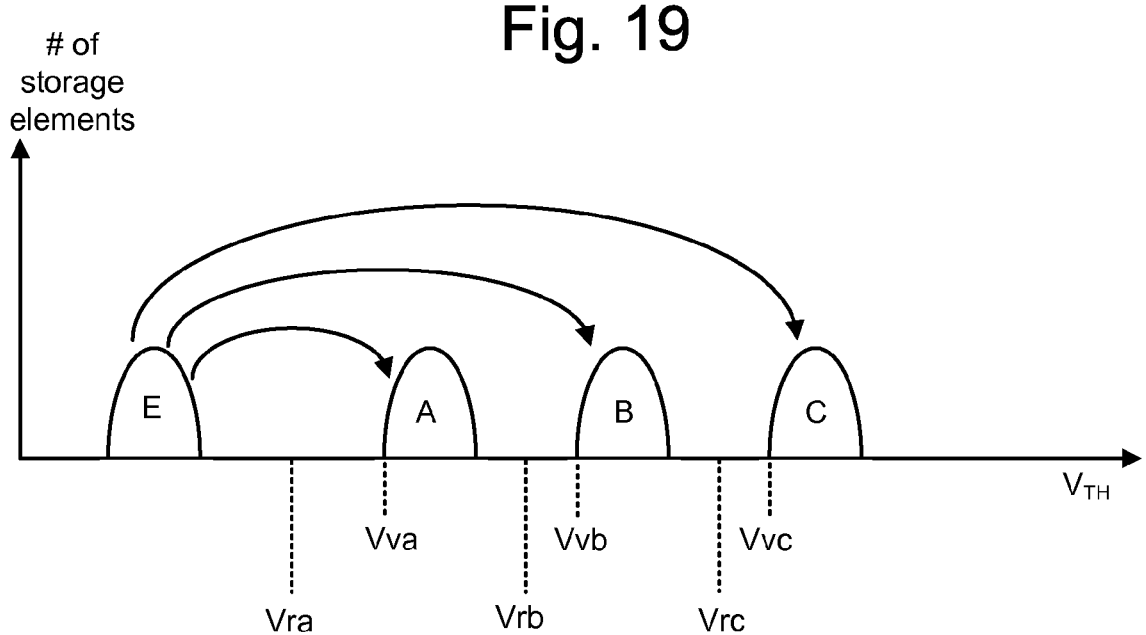
FIG. 19 depicts an example set of threshold voltage distributions.

FIG. 19 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 23 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 20:
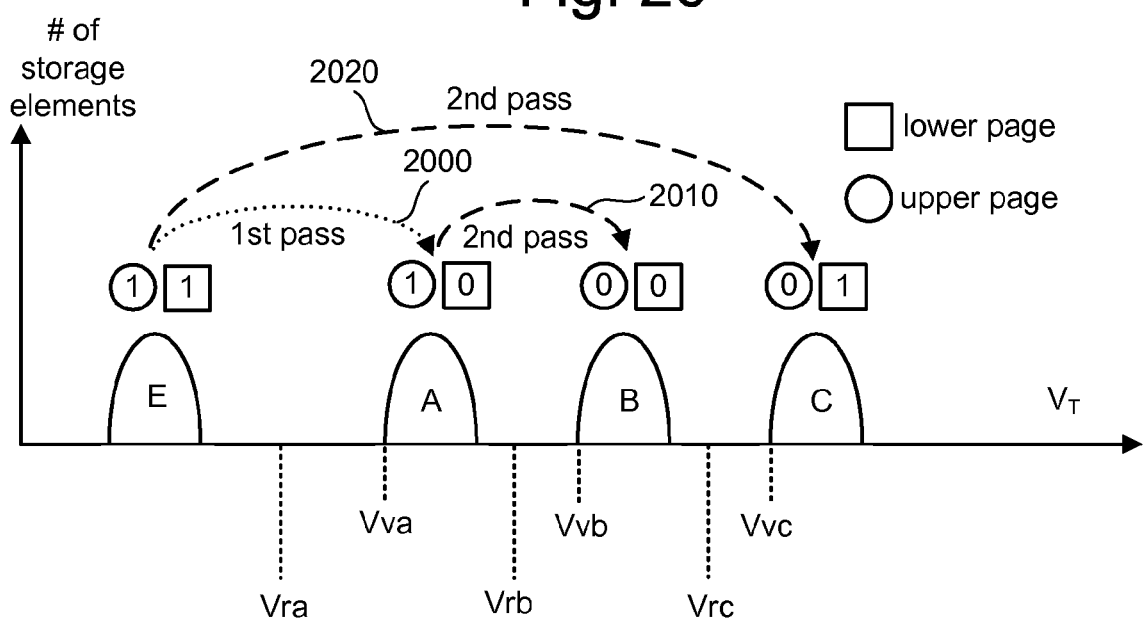
FIG. 20 depicts an example set of threshold voltage distributions.

FIG. 20 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2020. If the storage element had been programmed into state A as a result of the first programming pass, then the storage element is further programmed in the second pass so that the threshold voltage is increased to be within state B, as depicted by arrow 2010. The result of the second pass is to program the storage element into the state designated to store a logic "0" for the upper page without changing the data for the lower page. In both FIG. 19 and FIG. 20 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 21A:
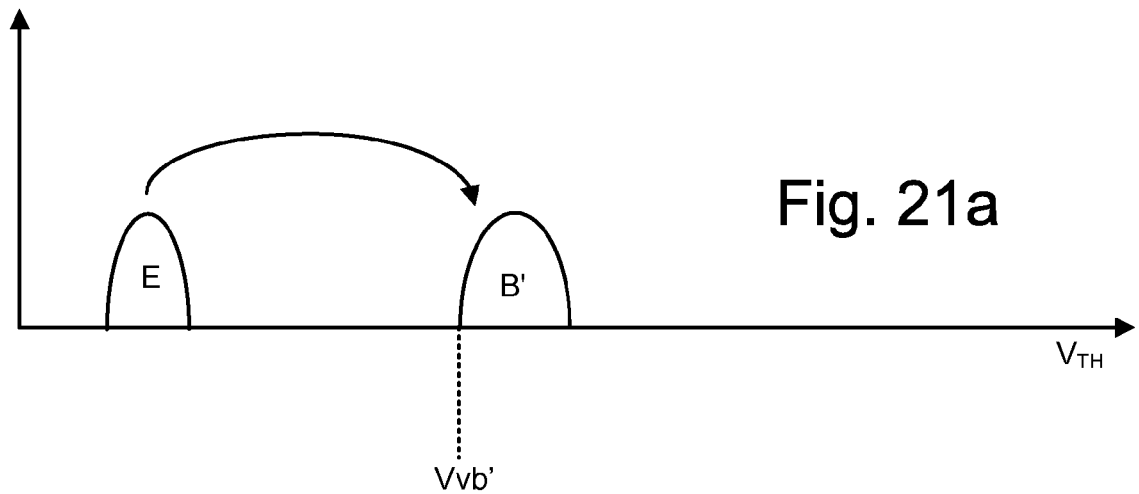
FIGS. 21a-c show various threshold voltage distributions and describe a process for programming non-volatile memory.
Figure 21B:
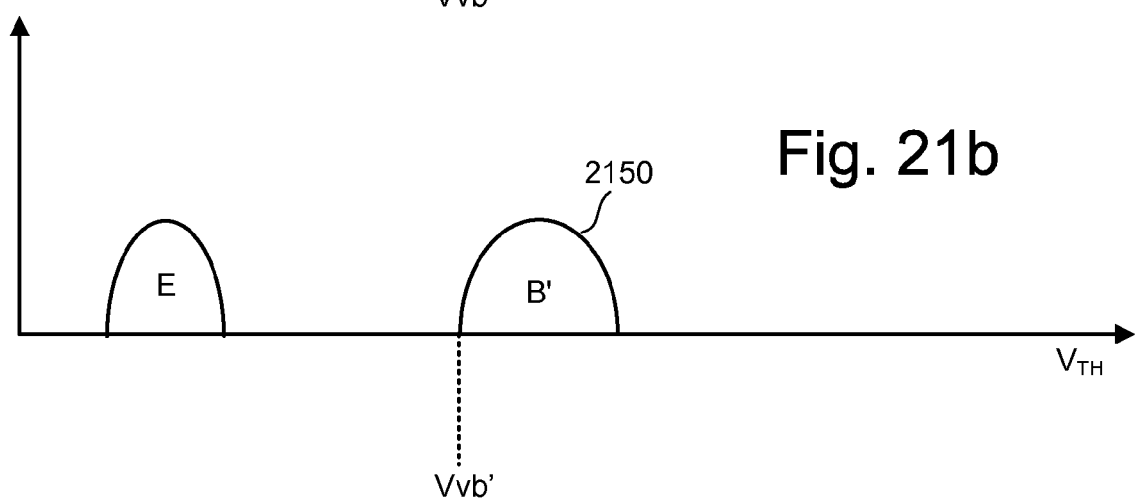
Figure 21C:
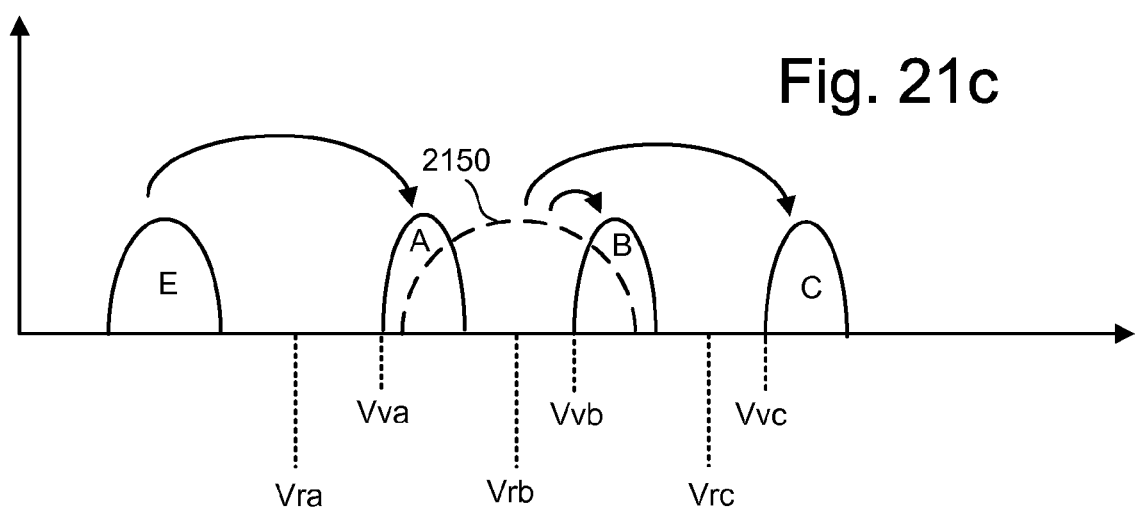

FIGS. 21a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 21a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 2150 of FIG. 21b. This apparent widening of the threshold voltage distribution will be remedied when programming the upper page.

FIG. 21c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2150 and the upper page data is to remain at 1, then the storage element will be programmed to final state B. If the storage element is in intermediate threshold voltage distribution 2150 and the upper page data is to become data 0, then the threshold voltage of the storage element will be raised so that the storage element is in state C.

The process depicted by FIGS. 21a-c reduces the effect of floating gate to floating gate coupling because only the upper page programming of neighbor storage elements will have an effect on the apparent threshold voltage of a given storage element. An example of an alternate state coding is to move from distribution 2150 to state C when the upper page data is a 1, and to move to state B when the upper page data is a 0.

Although FIGS. 21a-c provide an example with respect to four data states and two pages of data, the concepts taught can be applied to other implementations with more or fewer than four states and different than two pages.

Figure 21D:
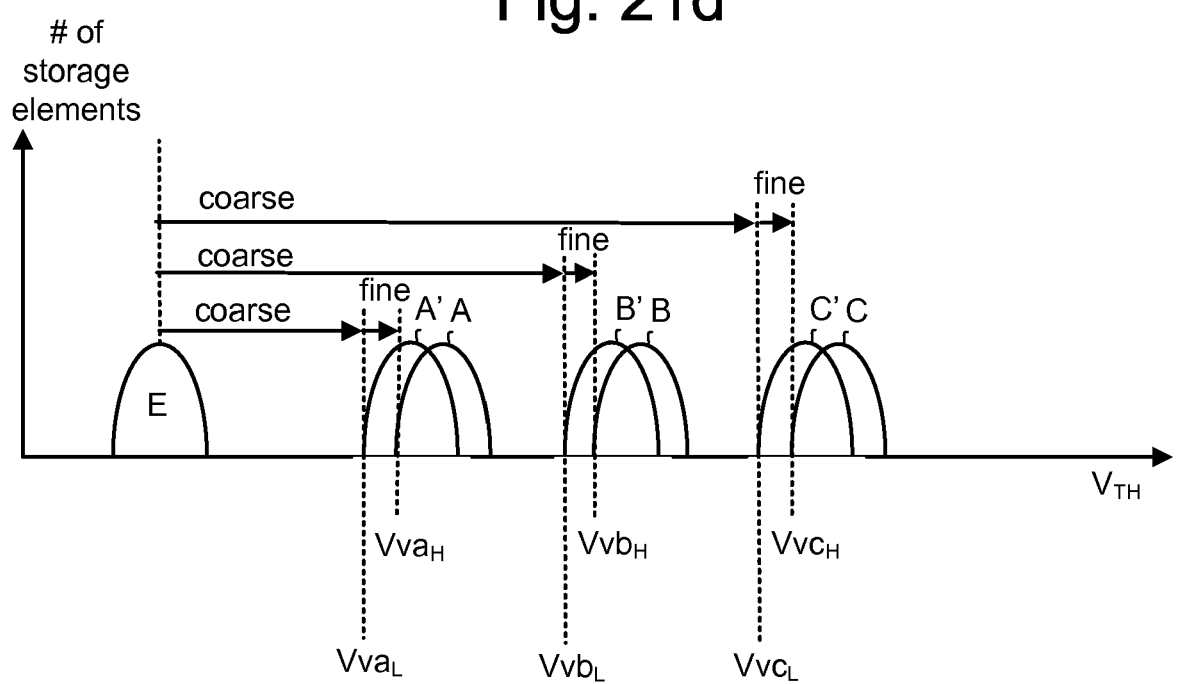
FIG. 21d describes a coarse/fine programming process.
Figure 23:
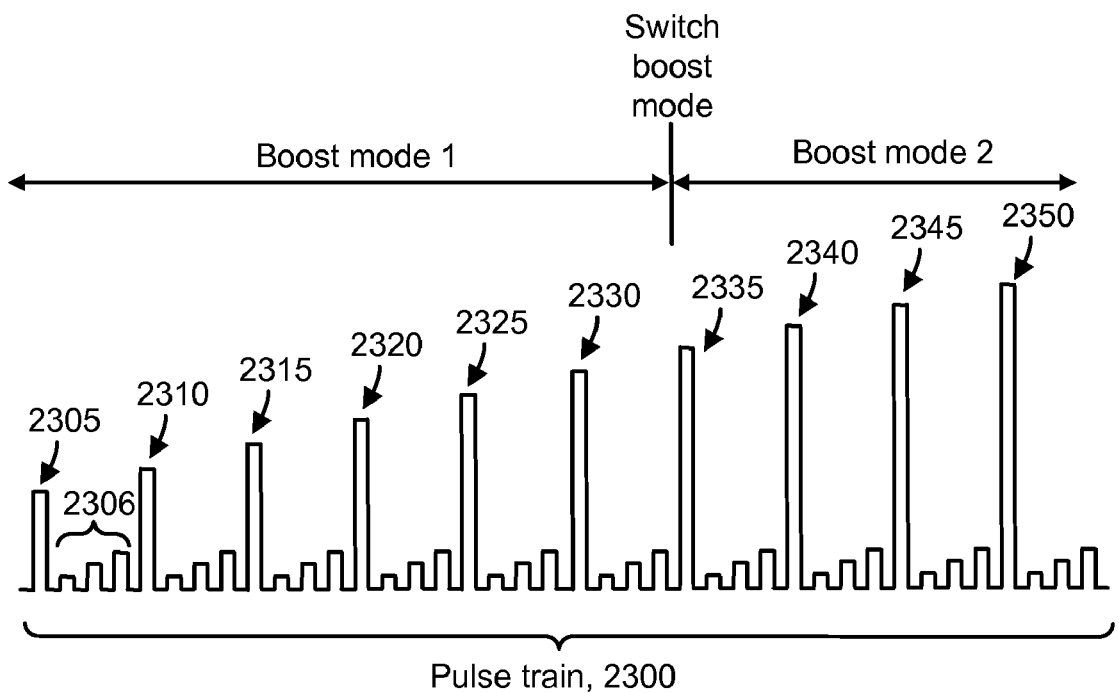
FIG. 23 depicts an example pulse train applied to the control gates of non-volatile storage elements during programming, and a switch in boost mode which occurs during a pulse train.
Figure 24:
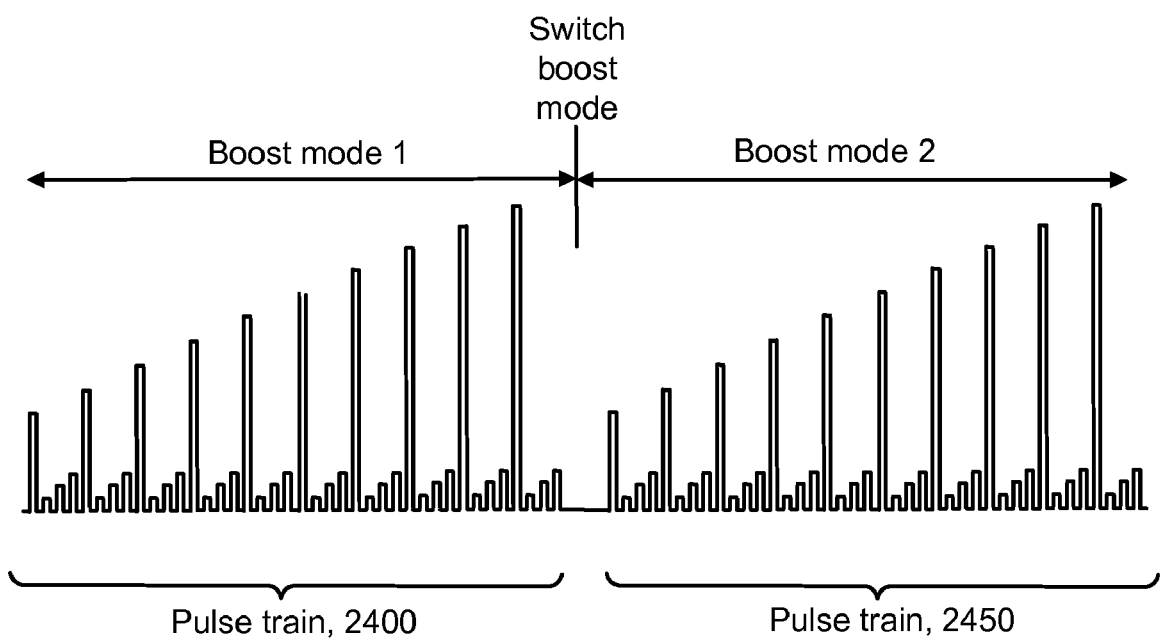
FIG. 24 depicts example pulse trains applied to the control gates of non-volatile storage elements during programming, and a switch in boost mode which occurs between pulse trains.

FIG. 21d describes a coarse/fine programming process. As mentioned previously in connection with FIG. 12, storage elements can be programmed initially in a coarse mode to move them quickly toward a target program condition and then in a fine mode to move them more slowly, with greater accuracy, to the target program condition. A fine programming mode can involve, e.g., using a reduced step size in the $V_{PGM}$ pulse train and/or applying an inhibit voltage on the bit line of a selected NAND string. Further, coarse-fine programming can occur in one-pass or multi-pass programming. In one-pass coarse/fine programming, there is a switch from course to fine programming during the $V_{PGM}$ pulse train as indicated in FIG. 23. In contrast, in multi-pass coarse/fine programming, coarse programming may be used during the first pass while fine programming is used during a second pass, for instance. The switch from course to fine programming can occur, e.g., between complete $V_{PGM}$ pulse trains as indicated in FIG. 24. The $V_{PGM}$ pulse train may additionally or alternatively use a lower range of values in the second or other additional programming pass. Multi-pass coarse/fine programming may be considered to be a specific type of multi-pass programming which generally involves programming storage elements to a target program condition in more than one pass, e.g., using more than one pulse train.

For example, storage elements may be programmed from an erased state, state E, to target program states A, B or C. In one approach, coarse programming is used to program the storage elements to interim states A', B' or C' which have associated verify levels of $Vva_L$, $Vvb_L$ or $Vvc_L$, respectively. The subscript "L" denotes that the verify level is associated with a lower state which is below the target state. Subsequently, fine programming is used to program the storage elements from the interim states to states A, B or C, which have associated verify levels of $Vva_H$, $Vvb_H$ or $Vvc_H$, respectively. The subscript "H" denotes that the verify level is associated with a higher state which is the final, target state. A threshold voltage of the programmed storage element is therefore increased from a first level (e.g., state A) to a second level (e.g., $Vva_L$, $Vvb_L$ or $Vvc_L$) during the first programming phase, and from the second level to a third level (e.g., $Vva_H$, $Vvb_H$ or $Vvc_H$) during the second programming phase.

FIG. 22 is a flow chart describing one embodiment of a method for programming non-volatile memory. In one implementation, storage elements are erased (in blocks or other units) prior to programming. In step 2200, a "data load" command is issued by the controller and input received by control circuitry 1510. In step 2205, address data designating the page address is input to decoder 1514 from the controller or host. In step 2210, a page of program data for the addressed page is input to a data buffer for programming. That data is latched in the appropriate set of latches. In step 2215, a "program" command is issued by the controller to state machine 1512.

Triggered by the "program" command, the data latched in step 2210 will be programmed into the selected storage elements controlled by state machine 1512 using the stepped program pulses 2305, 2310, 2315, 2320, 2325, 2330, 2335, 2340, 2345, 2350, . . . of the pulse train 2300 of FIG. 23 applied to the appropriate selected word line. In step 2220, the program voltage, $V_{PGM}$, is initialized to the starting pulse (e.g., 12 V or other value) and a program counter (PC) maintained by state machine 1512 is initialized at zero. In step 2225, an initial boosting mode is applied and in step 2230, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 2235, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2240, a check is made as to whether all of the data latches are storing logic "1." If all of the data latches are storing logic "1," the programming process is complete and successful because all selected storage elements were programmed and verified. A status of "PASS" is reported in step 2245.

If, in step 2240, it is determined that not all of the data latches are storing logic "1," then the programming process continues. In step 2250, the program counter PC is checked against a program limit value PCmax. One example of a program limit value is twenty; however, other numbers can also be used. If the program counter PC is not less than PCmax, then the program process has failed and a status of "FAIL" is reported in step 2255. If the program counter PC is less than PCmax, then $V_{PGM}$ is increased by the step size and the program counter PC is incremented in step 2260. At step 2265, a determination is made as to whether a boost mode switch criterion is met (see, e.g., FIG. 4). If such a criterion is met, the boosting mode is switched at step 2270, and the process loops back to step 2230 to apply the next $V_{PGM}$ pulse. If the boost mode switch criterion is not met at step 2265, the process loops back to step 2230 to apply the next $V_{PGM}$ pulse without changing the boosting mode.

FIG. 23 depicts an example pulse train 2300 applied to the control gates of non-volatile storage elements during programming, and a switch in boost mode which occurs during a pulse train. The pulse train 2300 includes a series of program pulses 2305, 2310, 2315, 2320, 2325, 2330, 2335, 2340, 2345, 2350, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2306 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 20), Vvb' (FIG. 21a), or $Vva_L$, $Vvb_L$ and $Vvc_L$ or $Vva_H$, $Vvb_H$ and $Vvc_H$ (FIG. 21d), or for instance.

A switch in the boost mode is depicted as occurring prior to applying program pulse 2335. Prior to the switch, a first boost mode is applied, while after the switch a second boost mode is applied. As mentioned, the voltages which are applied to word lines to implement a boost mode are applied when programming occurs, e.g., when a program pulse is applied. In practice, the boost voltages of a boost mode can be initiated slightly before each program pulse and removed after each program pulse. Thus, during the verify process, for instance, which occurs between program pulses, the boost voltages are not applied. Instead, read voltages, which are typically less than the boost voltages, are applied to the unselected word lines. The read voltages have an amplitude which is sufficient to maintain the previously programmed storage elements in a NAND string on when the threshold voltage of a currently-programmed storage element is being compared to a verify level.

Thus, in one approach, in a first programming phase, a first subset of program pulses (e.g., pulses 2305, 2310, 2315, 2320, 2325 and 2330) in the pulse train 2300 is applied to one or more storage elements and, in a second programming phase, a second subset of pulses (e.g., pulses 2335, 2340, 2345, 2350) in the pulse train is applied to the one or more storage elements. Each programming pass can therefore include multiple programming phases.

FIG. 24 depicts example pulse trains applied to the control gates of non-volatile storage elements during programming, and a switch in boost mode which occurs between pulse trains. In particular, a switch in the boost mode is depicted as occurring between the pulse trains 2400 and 2450. Prior to the switch, during the first pulse train 2400, a first boost mode is applied, while after the switch, during the second pulse train 2450, a second boost mode is applied. For example, the pulse train 2400 may be applied during the first pass of a multi-pass programming process while the pulse train 2450 is applied during a second pass of such a programming process. Thus, in one approach, in a first programming phase, a first pulse train (e.g., pulse train 2400) is applied to one or more storage elements on a selected word line and, in a second programming phase, a second pulse train (e.g., pulse train 2450) is applied to the one or more storage elements. Each programming pass can therefore be coincident with a programming phase.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:

implementing a first boosting mode but not a second boosting mode during a first programming phase in which programming of at least one storage element in a set of non-volatile storage elements occurs, the at least one storage element is in communication with a selected word line, the first programming phase applies program pulses to the selected word line, and each program pulse in the first programming phase is followed by a verify operation; and implementing the second boosting mode but not the first boosting mode during a second programming phase in which programming of the at least one storage element continues, the second programming phase applies program pulses to the selected word line, and each program pulse in the second programming phase is followed by a verify operation.

2. The method of claim 1, wherein:
a threshold voltage of the at least one storage element is increased from a first level to a second level during the first programming phase, and from the second level to a third level during the second programming phase.

3. The method of claim 1, wherein:
the first programming phase comprises a first pass of a multi-pass programming technique and the second programming phase comprises a second pass of the multi-pass programming technique.

4. The method of claim 1, wherein:
the first programming phase involves coarse programming and the second programming phase involves fine programming.

5. The method of claim 1, further comprising:
switching from implementing the first boosting mode to implementing the second boosting mode based on when at least one other storage element in the set of non-volatile storage elements reaches a specified programming condition.

6. The method of claim 1, further comprising:
switching from implementing the first boosting mode to implementing the second boosting mode based on a number of programming cycles experienced by the set of non-volatile storage elements, where the set of non-volatile storage elements programs faster as the set of non-volatile storage elements undergoes additional programming cycles.

7. The method of claim 1, wherein:
the set of non-volatile storage elements is provided in a plurality of NAND strings, including a selected NAND string in which the at least one storage element is provided, and an unselected NAND string, and the first and second boosting modes boost a channel of the unselected NAND string.

8. The method of claim 1, wherein:
the implementing of the first boosting mode comprises applying a first voltage to an end word line associated with the unselected NAND string during each program pulse of the first programming phase, and the implementing of the second boosting mode comprises applying a second voltage to the end word line during each program pulse of the second programming phase.

9. The method of claim 1, wherein:
the implementing of the first boosting mode comprises applying a voltage to an unselected word line of the set of non-volatile storage elements which is adjacent to the selected word line; and
the implementing of the second boosting mode comprises applying a different voltage to the unselected word line.

10. The method of claim 1, wherein:
the implementing of the first boosting mode comprises applying a voltage to an unselected word line of the set of non-volatile storage elements which is non-adjacent to the selected word line; and
the implementing of the second boosting mode comprises applying a different voltage to the unselected word line.

11. A non-volatile storage system, comprising:
a set of non-volatile storage elements; and
one or more control circuits in communication with the set of non-volatile storage elements, the one or more control circuits implement a first boosting mode but not a second boosting mode during a first programming phase in which programming of at least one storage element in the set of non-volatile storage elements occurs, the first programming phase applies program pulses to the set of non-volatile storage elements, and the first programming phase applies verify pulses to the set of non-volatile storage elements between successive ones of the program pulses of the first programming phase, and implement the second boosting mode but not the first boosting mode during a second programming phase in which programming of the at least one storage element continues, the second programming phase applies program pulses to the set of non-volatile storage elements, and the second programming phase applies verify pulses to the set of non-volatile storage elements between successive ones of the program pulses of the second programming phase.

12. The non-volatile storage system of claim 11, wherein:
a threshold voltage of the at least one storage element is increased from a first level to a second level during the first programming phase, and from the second level to a third level during the second programming phase.

13. The non-volatile storage system of claim 11, wherein:
the first programming phase comprises a first pass of a multi-pass programming technique and the second programming phase comprises a second pass of the multi-pass programming technique.

14. The non-volatile storage system of claim 11, wherein:
the set of non-volatile storage elements is provided in a plurality of NAND strings, including a selected NAND string in which the at least one storage element is provided, and an unselected NAND string, and the first and second boosting modes boost a channel of the unselected NAND string.

15. The non-volatile storage system of claim 11, wherein:
the first programming phase involves coarse programming and the second programming phase involves fine programming.

16. The non-volatile storage system of claim 11, wherein:
the one or more control circuits switch from implementing the first boosting mode to implementing the second boosting mode based on when at least one other storage element in the set of non-volatile storage elements reaches a specified programming condition.

17. The non-volatile storage system of claim 11, wherein:
the one or more control circuits switch from implementing the first boosting mode to implementing the second boosting mode based on a number of programming cycles experienced by the set of non-volatile storage elements, where the set of non-volatile storage elements programs faster as the set of non-volatile storage elements undergoes additional programming cycles.

18. The non-volatile storage system of claim 11, wherein:
the one or more control circuits, to implement the first boosting mode, apply a voltage to an unselected word line of the set of non-volatile storage elements; and
the one or more control circuits, to implement the second boosting mode, apply a different voltage to the unselected word line.

19. A method for operating non-volatile storage, comprising:
- implementing a first boosting mode during a first programming phase in which programming of at least one storage element in a set of non-volatile storage elements occurs; and
- implementing a second boosting mode during a second programming phase in which programming of the at least one storage element continues;
- the set of non-volatile storage elements are provided in a plurality of NAND strings, including a selected NAND string in which the at least one storage element is provided, and an unselected NAND string, the first and second boosting modes boost a channel of the unselected NAND string;
- the implementing of the first boosting mode comprises boosting the channel without isolating a portion of the channel on a source-side of the unselected NAND string from a portion of the channel on a drain-side of the unselected NAND string; and
- the implementing of the second boosting mode comprises isolating a portion of the channel on a source-side of the unselected NAND string from a portion of the channel on a drain-side of the unselected NAND string.

20. The method of claim 19, wherein:
the source-side is a programmed side of the unselected NAND string and the drain-side is an erased side of the unselected NAND string.

* * * * *